United States Patent [19]

Doreswamy et al.

[11] Patent Number: 5,784,600

[45] Date of Patent: Jul. 21, 1998

[54] METHOD OF GENERATING EXACT-LENGTH WIRES FOR ROUTING CRITICAL SIGNALS

[75] Inventors: Manjunath Doreswamy; Aleksandar Pance, both of Sunnyvale, Calif.

[73] Assignee: Sun Microsystems, Inc., Palo Alto, Calif.

[21] Appl. No.: 673,115

[22] Filed: Jul. 1, 1996

[51] Int. Cl.⁶ .................................................. G06F 17/50
[52] U.S. Cl. ......................................... 395/558; 364/491
[58] Field of Search .................... 395/558; 364/488–491

[56] References Cited

U.S. PATENT DOCUMENTS

| 4,613,941 | 9/1986 | Smith et al. | 364/490 |
| 5,394,337 | 2/1995 | Shinjo | 364/490 |
| 5,483,481 | 1/1996 | Hizume et al. | 364/490 X |
| 5,583,788 | 12/1996 | Kuribayashi | 364/490 |
| 5,629,860 | 5/1997 | Jones et al. | 364/490 |
| 5,644,500 | 7/1997 | Miura et al. | 364/490 |

*Primary Examiner*—Thomas M. Heckler
*Attorney, Agent, or Firm*—Beyer & Weaver, LLP

[57] ABSTRACT

Disclosed is an automated method for adjusting wire lengths between connected circuit elements of an integrated circuit. The method includes the following steps: (1) receiving a value specifying a wire length that must be provided between terminals of two integrated circuit elements in the integrated circuit design; (2) defining a routing region in which the wire can be routed; and (3) automatically specifying a wire route including a serpentine section within the routing region for connecting the terminals. The serpentine section will include one or more legs sized to ensure that the wire route has the specified wire length. Specifically disclosed is the application of this method to size wiring between two clock buffers in separate and adjacent stages of a clock distribution network. The two clock buffers may be provided in third and fourth stages of the clock distribution network.

39 Claims, 15 Drawing Sheets

620

| # of L5 Buffers | Line Length 0-99 μm | Line Length 100-199 μm | Line Length 200-299 μm | Line Length 300-399 μm | ... | Line Length x-(x+99) μm |
|---|---|---|---|---|---|---|
| 1 | 1x | 1x | 1x,2x | 1x, 2x | ... | 5x |
| 2 | 1x, 2x,3x | 1x, 2x,3x,4x | 2x,3x,4x | 2x,3x,4x | ... | 4x,5x |
| 3 | 2x, 3x,4x | 3x,4x,5x | 3x,4x,5x | 3x,4x,5x | ... | 7x,8x |
| 4 | 3x,4x | 4x,5x | 4x,5x | 4x,5x | ... | 8x,9x |
| 5 | 4x,5x | 5x,6x | 5x,6x | 5x,6x | ... | 8x, 9x,10x |
| ... | ... | ... | ... | ... | ... | ... |
| n | 15x,16x | 15x,16x | 16x | 16x | ... | 17x |

Figure 9

METHOD OF GENERATING EXACT-LENGTH WIRES FOR ROUTING CRITICAL SIGNALS

CROSS REFERENCE TO RELATED APPLICATIONS

This application is related to U.S. patent application Ser. No. 08/673,041 (Attorney Docket No. SUN1P087/P1266) filed on the same day as the instant application, entitled METHOD AND APPARATUS FOR SIZING BUFFERS TO PROVIDE MINIMAL SKEW, and naming Manjunath Doreswamy, Aleksandar Pance, and David Lin as inventors. That application is incorporated herein by reference for all purposes.

BACKGROUND OF THE INVENTION

The present invention relates to methods of designing single distribution networks in integrated circuits. More specifically, the invention relates to methods of routing lines between clock buffers such that skew is minimized between stages of a buffer network.

Some signals such as clock signals must be propagated throughout an entire integrated circuit. To this end, integrated circuits are designed with clock distribution networks containing tree-like arrangements of clock buffers segregated into stages. First stage clock buffers receive clock signals directly from a clock. The network branches from these first stage buffers so that each first stage clock buffer typically feeds the clock signals to multiple second stage clock buffers. Each of these second stage buffers, in turn, feed the clock signals to multiple third stage buffers, etc. Ultimately, the clock signals reach the end of the network and are provided to appropriate circuit elements such as flip flops.

A hypothetical clock buffer network 100 is shown in FIG. 1A. A clock signal for the entire microprocessor is fed directly to a first stage clock buffer 102 (referred to as an "L1 buffer" herein). From there, the signal is provided to other buffers throughout the network tree and ultimately to various functional blocks including control blocks such as control block 114a and control block 114b, data paths such as data path 116, and mega-cells such as mega-cell 118. Control blocks are employed to control the delivery of signals to certain circuitry at appropriate times. For example, a control block may direct one value from a particular register and a second value from a ROM to an accumulator at the same time so that the two values can be summed. A data path contains the circuitry (such as multiplexers, accumulators, shift registers, multipliers, logic gates, etc.) for performing a sequence of operations on data present to the data path. A control block may specify the particular data and signals to be presented the various elements of a data path at appropriate times (as specified by a cycle count for example).

In the clock network shown, the clock signal branches through five stages (including the first stage at buffer L1) before reaching the logic and memory circuitry of the integrated circuit. The second stage includes multiple L2 buffers such as buffers 104a and 104b, all directly fed by the output of the L1 buffer 102. The output lines of the L2 buffers may branch to feed multiple L3 buffers at a third stage of the clock distribution network. Examples of such L3 buffers shown FIG. 1A are buffers 106a and 106b.

The L3 buffers may output clock signals directly to mega-cells, data paths, and control blocks. As shown in the hypothetical clock distribution network 100, L3 buffers 106a and 106b feed control blocks 114a and 114b, respectively. Within control block 114a, the clock signals are received by multiple L4 buffers, including L4 buffer 104a. Similarly, within control block 114b, multiple L4 buffers including L4 buffer 108b receive the clock signals from L3 buffer 106b. Each of the L4 buffers in control blocks 114a and 114b, in turn, feeds clock signals to one or more L5 buffers. For example, L4 clock buffer 108a feeds multiple L5 buffers, including buffers 110a and 110c. Similarly in control block 114b, L4 buffer 108b feeds L5 buffer 110b, as well as other L5 buffers within the control block. Each L5 buffer, in turn, provides clock signals to multiple flip flop circuits in the control block. For example, L5 buffer 110a provides a clock signal to a collection of three flip flops 112.

The clock distribution network 100 functions to efficiently deliver the clock signals to all IC circuitry requiring clocking. In this regard, it is important that the clock signals maintain sharp transitions (i.e. short rise and fall times) as well as sufficient signal strength. The clock buffers at each stage of the network serve these needs. Typically, though not necessarily, the clock buffers are simply two inverters connected in series.

In addition to delivering strong sharp clock signals, the clock distribution network ensures that all circuitry receives the same clock pulses at nearly the same time. Any difference between the time when one circuit (e.g., one flip flop in control block 114a) receives a clock pulse and when another circuit (e.g., one flip flop in control block 114b) receives that same clock pulse is referred to as "skew." Typically, microprocessor designers are given a "skew budget" for each stage of the clock distribution network. For example, the maximum skew between any two L2 buffers might be set at 20 picoseconds. Similar skew budgets may be set for each successive stage of the clock distribution network.

FIG. 1B is a signal diagram illustrating skew between L4 buffers 108a and 108b. A clock signal A occurs as an input signal to L4 clock buffer 108a, and a clock signal B occurs as an input signal to L4 buffer 108b. As shown in FIG. 1B, the point at which the clock signal transitions from low to high at L4 buffer 108a precedes the point at which the same signal transitions from low to high at L4 clock buffer 108b. This difference is shown to be the skew of the clock signal at the fourth stage of the distribution network. Normally, skew is measured from the points at which the clock is 50% of the way from low to high or high to low.

Various design features increase the skew at any given stage. For example, variations in the line lengths coupling adjacent stages contribute to skew. Shorter lines will deliver signals faster than longer lines. Other properties of the line may also contribute to skew. For example, the proximity of a given line to other lines may effect skew. Some lines may experience greater impedance per unit length than others due to capacitive coupling with adjacent lines, for example.

In addition, the load driven by a clock buffer may affect the speed at which a clock signal traverses the network. Buffers driving large loads will propagate signals more slowly than buffers driving comparably smaller loads. Thus, a highly unbalanced load across the network will increase clock skew. Note that in the clock network example described here the load is determined by the number and size of the buffers at the next stage downstream from the driving buffer.

Still further, the propagation characteristics of the clock buffers themselves may contribute to skew. Typically, clock distribution networks are designed with various types of buffers. A given design may employ ten or more different types of L4 buffer for example. A designer may for various reasons choose to place specific ones of these buffer types at specific locations in the network. Each of these clock buffers will have different signal propagation characteristics resulting from the types of transistors they employ, their internal line lengths, etc.

From the above, it should be apparent that designers must choose appropriate buffers and route lines over appropriate paths to minimize skew and thereby remain within the skew budget allocated for each stage of the clock distribution network. While microprocessor designers may modify any of the above parameters to achieve minimal skew, the present invention is concerned primarily with adjusting the line lengths between buffers in adjacent stages of a network. As the lines connecting L3 and L4 clock buffers are typically adjustable by a designer (they are not set in a standard place and route block), much of the discussion herein will use such lines as examples. Such lines include lines 120 and 122 within network 100 of FIG. 1A, for example.

Traditionally, line length adjustments have been premised on a rather simple concept: all other factors being even, differences in wire length will produce skew. Thus, much design effort is often focused on equalizing the wire lengths for each direct connection between a clock buffer in one stage and the clock buffer in the next stage. The procedure for accomplishing this can be understood generally with reference to FIGS. 2A and 2B. FIG. 2A shows a hypothetical segment 140 of a clock distribution network at an early stage of its design. Included in segment 140 is an L3 buffer 142 which receives a clock signal from an arbitrary L2 buffer on an input line 144. L3 buffer 142 then outputs the clock signal to a first control block 146 and second control block 148. More specifically, L3 buffer 142 outputs the clock signal to an L4 buffer 150 within control block 146 and an L4 buffer 152 within control block 148.

The clock signal output by L3 clock buffer 142 first passes through a wire segment 156, then through a wire segment 158, and finally through a wire segment 160 to reach L4 buffer 150. That same signal reaches L4 buffer 152 by passing through wire segments and 156 and 158 as in the case of signals provided to buffer 150. However, rather than passing through wire segment 160, clock signals destined for L4 buffer 152 pass through a wire segment 159 and a wire segment 162 after passing through the wire segment 158. Assuming that wire segments 160 and 162 are of equal length, it can be seen that clock signals passing to L4 buffer 152 must pass through an additional length of wire (equal to the length of wire segment 159) not required to reach L4 buffer 150. Thus, clock signals arrive at L4 buffer 152 somewhat later than those same signals that reach L4 buffer 150.

To reduce the system skew, the line lengths from all L3 buffers to all connected L4 buffers should be nearly equal. To accomplish this, conventional design requires that wire segment 160 be replaced with a new wire segment having a length equal to the sum of segments 162 and 159. As shown in FIG. 2B, this has been accomplished by inserting a "serpentine" segment 166. Thus, the clock signal reaching L4 buffer 150 from L3 buffer 142 traverses a longer wire length than it would have if there had been a simple direct connection as shown in FIG. 2A. By inserting serpentine segment 166, clock skew is minimized.

In conventional design procedures, a designer is provided with a clock distribution network containing many segments such as segment 140 shown in FIG. 2A having rather direct connections between buffers at adjacent stages in the network. The designer must then manually insert serpentine segments to reduce clock skew as described. Typically, the designer will identify the L3–L4 buffer pair having the longest connection length in the entire distribution network. Then, the designer must identify for each additional L3–L4 buffer pair, how much deviation exists between its connection length and the longest connection length previously identified. Then, from this difference, the designer manually generates a serpentine of appropriate length and inserts it into the lines connecting the L3–L4 buffer pair under consideration. Thus, the total line length connecting these buffer is made nearly equal to the previously-identified longest connection length.

Not surprisingly, this is a rather tedious and time consuming aspect of the microprocessor design process. In designing a sophisticated microprocessor such as the Ultra-SPARC microprocessor available from Sun Microsystems, Inc. of Mountain View, Calif., it may take a designer several weeks or more to perform the above-described line routing on an entire chip. As it is becoming increasingly important for microprocessors and other integrated circuits to proceed from conception, through design, and to market in a very short time, it would very desirable to find a technique for routing lines between buffers in an expeditious fashion.

SUMMARY OF THE INVENTION

The present invention provides an automated method for adjusting wire lengths between connected circuit elements of an integrated circuit. Often this method will be employed to adjust wire lengths between clock buffers in adjacent stages of a clock buffer network. Preferably the invention is implemented as a design tool employed by designers of integrated circuits.

In one aspect, the invention provides a method of determining a layout of at least some routing wires in the integrated circuit design. The method may be characterized as including the following steps: (1) receiving a value specifying a wire length that must be provided between terminals of two integrated circuit elements in the IC design; (2) defining a routing region in which the wire can be routed; and (3) automatically specifying a wire route including a serpentine section within the routing region for connecting the terminals. The serpentine section will include one or more "legs" (undulations) sized to ensure that the wire route has the specified wire length. Preferably, the two integrated circuit elements are two clock buffers provided in separate and adjacent stages of a clock distribution network. In one particular embodiment, the two clock buffers are provided in third and fourth stages of the clock distribution network.

The value specifying the wire length may be input by a user or generated automatically by a computer program. Regardless of how it is generated, the value will usually be chosen to minimize skew between integrated circuit elements in adjacent stages of the integrated circuit design. Thus, the value may be the difference between the longest wire directly connecting two adjacent stages and the current wire being considered.

The process of defining a routing region in which the wire can be routed may include the following steps: (i) identifying locations of the terminals of the two integrated circuit elements; and (ii) defining a rectangular bounding box having its corners proximate the locations of the terminals. Of course, other non-rectangular routing regions may be defined.

Initially, before the new wire route is presented to the user (by display on a computer screen for example), it may be necessary to ensure that there is enough room within the routing region to house a wire route at least equal in length to the specified wire length. This may be accomplished as follows: (i) determining a maximum wire length that can be provided in the wire route including the serpentine section; (ii) determining if the maximum wire length is less than the value specifying the wire length that must be provided between the terminals; and (iii) if the maximum wire length is less than the specified wire length, outputting a message specifying the difference between the maximum wire length and the value specifying the wire length. Typically, the maximum wire length is calculated by filling the entire routing region with a serpentine section.

Sometimes the routing region will overlap with an obstruction such as a metal interconnect provided on the same metallization level as the routing path between IC elements. Of course, the serpentine segment should not overlap with the obstruction. Otherwise a short would occur. To ensure that no overlap occurs, the process of this invention preferably includes the following steps: (i) determining whether the routing region contains any obstructions that would prevent wire from being routed through or adjacent to such obstructions; and (ii) if the routing region does contain one or more such obstructions, redefining, if possible, the routing region to avoid such obstructions.

Another aspect of the invention is a computer system capable of specifying an integrated circuit design and generating a wire connection between terminals of two integrated circuit elements in the integrated circuit design. This computer system may be characterized as including the following elements: (1) a design tool for representing the layout of features of the integrated circuit design; and (2) a routing tool which can automatically specify a wire route of specified wire length for connecting the terminals. As with the process described above, the wire route will have at least one serpentine section with one or more legs sized to meet a specific wire length requirement. Typically the computer system will include a display screen and a graphical user interface which can display the integrated circuit design and the wire route in response to specified user inputs.

· Preferably, the routing tool is configured to accept inputs specifying routing parameters such as required line length and serpentine shape characteristics. Preferably, it is also configured to define a bounding box having two corners proximate the locations of the terminals. The routing tool then automatically defines a wire route to be enclosed within the bounding box. The routing tool should define the bounding box to avoid any obstructions that would prevent wire from being routed through such obstructions.

BRIEF DESCRIPTION OF THE DRAWINGS

FIG. 9 is a representational depiction of a clock buffer table.

DESCRIPTION OF THE PREFERRED EMBODIMENTS

Generally, the invention employs various process steps involving data stored in computer systems. Useful machines for performing the operations of the present invention include general purpose digital computers or other similar devices. The present invention relates to method steps for operating a computer in processing electrical or other physical signals to generate other desired physical signals.

The present invention also relates to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given below.

Figure 3:
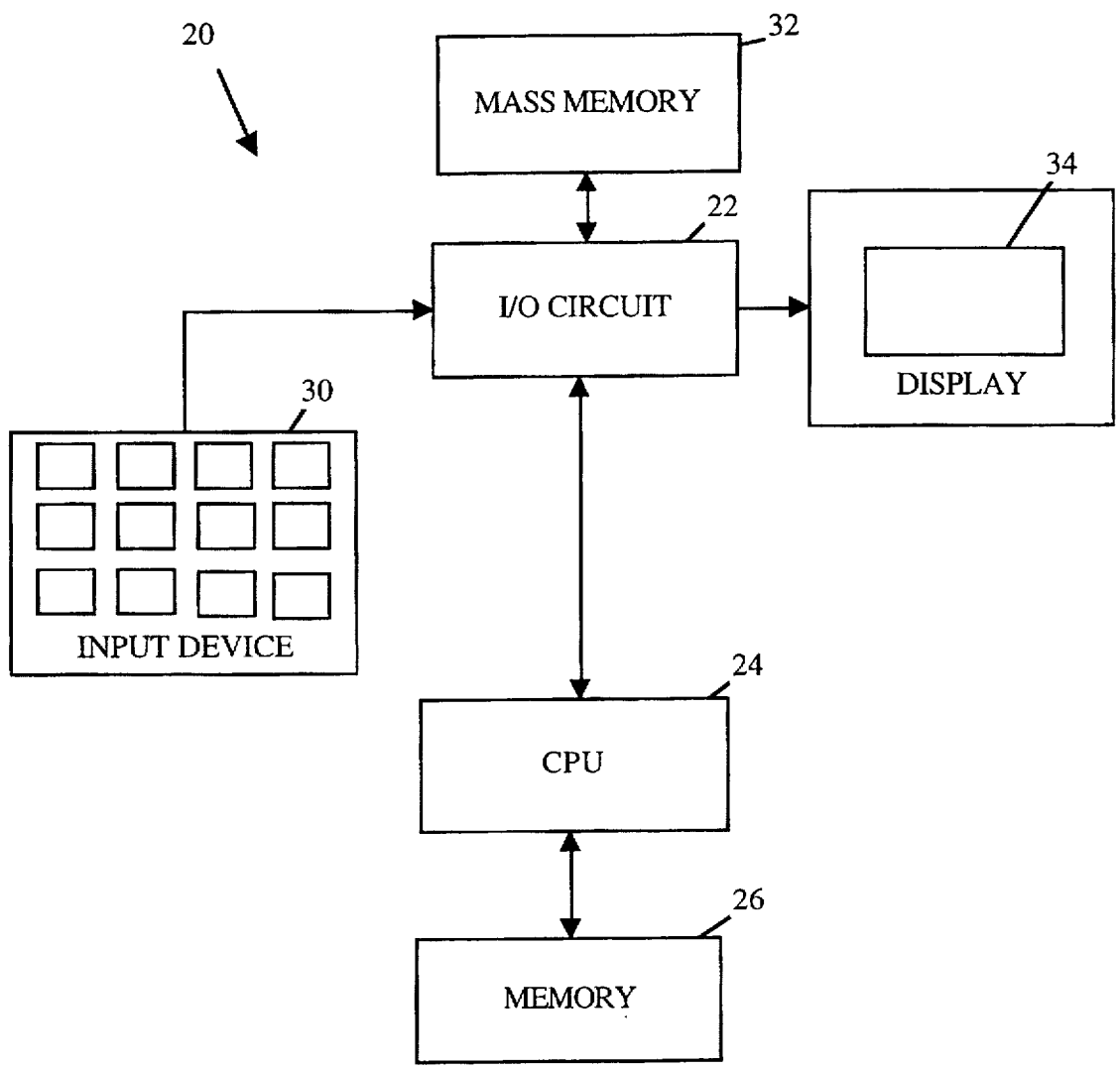
FIG. 3 is block diagram of a basic computing system that may be employed to implement the methods of the present invention.

FIG. 3 illustrates one suitable computer-based system for implementing the present invention. Shown is a computer 20 which includes an input/output circuit 22 used to communicate information in appropriately structured form to and from the parts of computer 20 and associated equipment, a central processing unit 24, and a memory 26. These components are those typically found in most general and special purpose computers 20 and are intended to be representative of this broad category of data processors.

FIG. 3 also illustrates an input device 30 shown as a keyboard. It should be understood, however, that the input device 30 may actually be a network connection, a tablet and stylus, a voice or handwriting recognizer, or some other well-known input device such as, of course, another computer. A mass memory device 32 is coupled to the input/ output circuit 22 and provides additional storage capability for the computer 20. The mass memory device 32 may be used to store programs, data and the like and may take the form of a magnetic hard drive, semiconductor memory, or some other well known device. It will be appreciated that the information retained within the mass memory device 32, may, in appropriate cases, be incorporated in standard fashion into computer 20 as part of the memory 26.

In addition, a display monitor 34 is illustrated which is used to display the images being generated by the present invention. Such a display monitor 34 may take the form of any of several well-known varieties of conventional cathode ray tube displays, flat panel displays, thin CRT displays, or some other well known type of display.

As is well-known, the memory 26 may store programs which represent a variety of sequences of instructions for execution by the central processing unit 24. For example, the compiled test programs for executing on a device under test may be stored within the memory 26.

Suitable computers for use in implementing the present invention may be obtained from various vendors. In one preferred embodiment, an appropriately programmed Sun SPARC workstations (Sun Microsystems, Mountain View, Calif.) may be used to perform the steps associated with this invention. Other suitable computers include mainframe computers such as a VAX (Digital Equipment Corporation, Maynard, Mass.) or Cray Supercomputer (Cray Research), multiprocessor computers such as those produced by Thinking Machines (Cambridge, Mass.), workstations such as the HP735 workstation (Hewlett Packard, Palo Alto, Calif.) or Silicon Graphics machines (Silicon Graphics, Mountain View, Calif.), personal computers such as Macintosh computers (Apple Computer, Cupertino, Calif.) or IBM or IBM compatible personal computers.

It should be understood that the present invention also relates to machine readable media on which are stored line routing designs produced in accordance with the requirements of this invention, or program instructions for performing methods of this invention. Such media include, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

While the present invention may be implemented in many different ways, it is preferably implemented as a software routine (routing tool) employed with a software design tool capable of displaying a microprocessor design layout at any stage in the design process. In one preferred embodiment, the software design tool is the GDT available from Mentor Graphics of Wilson, OR. The routing tool of this invention is preferably configured to accept inputs specifying routing parameters such as required line length and serpentine shape characteristics. Program instructions implementing the process of this invention are typically provided on a computer readable medium such as one of those described above and will sometimes be transported over a communications network.

By the time that the methods and apparatus of the present invention are brought into the process, most of the control blocks, data paths, and mega cells have already been designed and positioned in the integrated circuit. Further, the locations of most buffers or elements of the signal distribution network have been fixed. Some of these elements will be positioned in standard place and route blocks or other regions where the connecting lines can not be adjusted. Other of these elements will be positioned where the connecting lines can be adjusted to minimize skew. It is the adjustable lines that the present invention is concerned with. As noted, such lines connect L3 and L4 buffers in clock distribution networks.

To aid in understanding the invention, it will now be described in the context a procedure for routing wires between L3 and L4 buffers in a clock distribution network. It should be understood that the routing techniques described herein may, in principle, be employed to equalize wire lengths between any two circuit elements in an integrated circuit signal network. Such circuit elements may be virtually any functional elements or gates such as, for example, latches, memory cells, buffers, I/O cells, etc. In a preferred embodiment, the circuit elements are provided in adjacent stages of a network in an integrated circuit. Generally, the purpose of such routing will be to minimize skew in microprocessor signals propagated through the clock network.

Figure 1A:
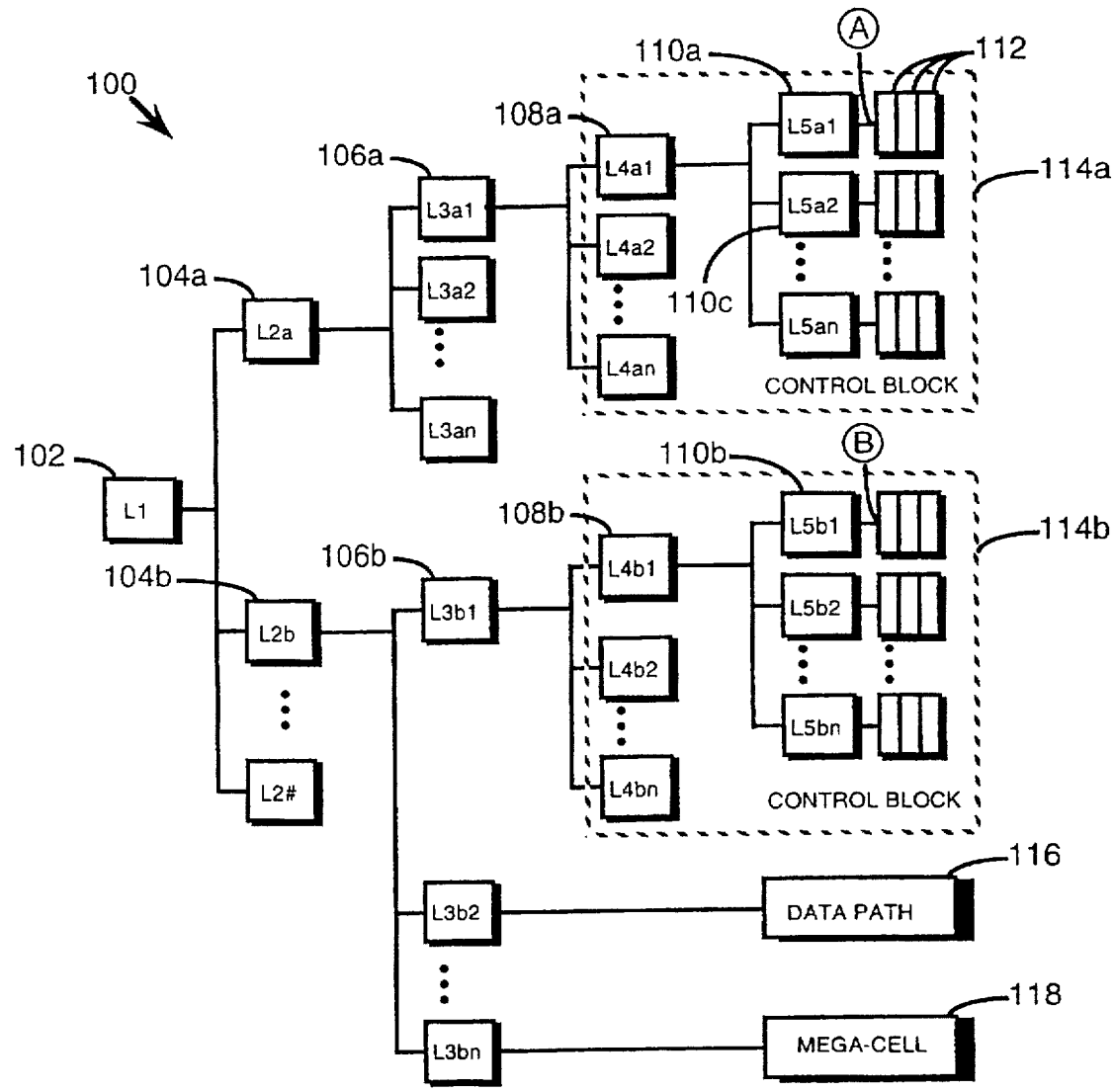
FIG. 1A is a block representation of a hypothetical clock distribution network for an integrated circuit.
Figure 1B:
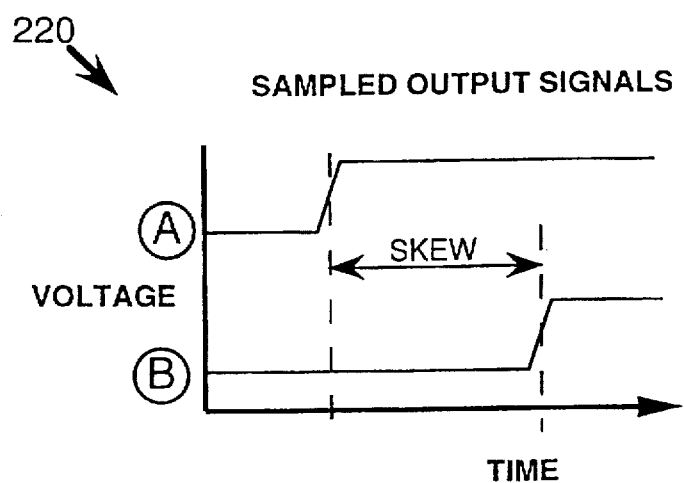
FIG. 1B is a signal diagram illustrating the concept of skew.
Figure 2A:
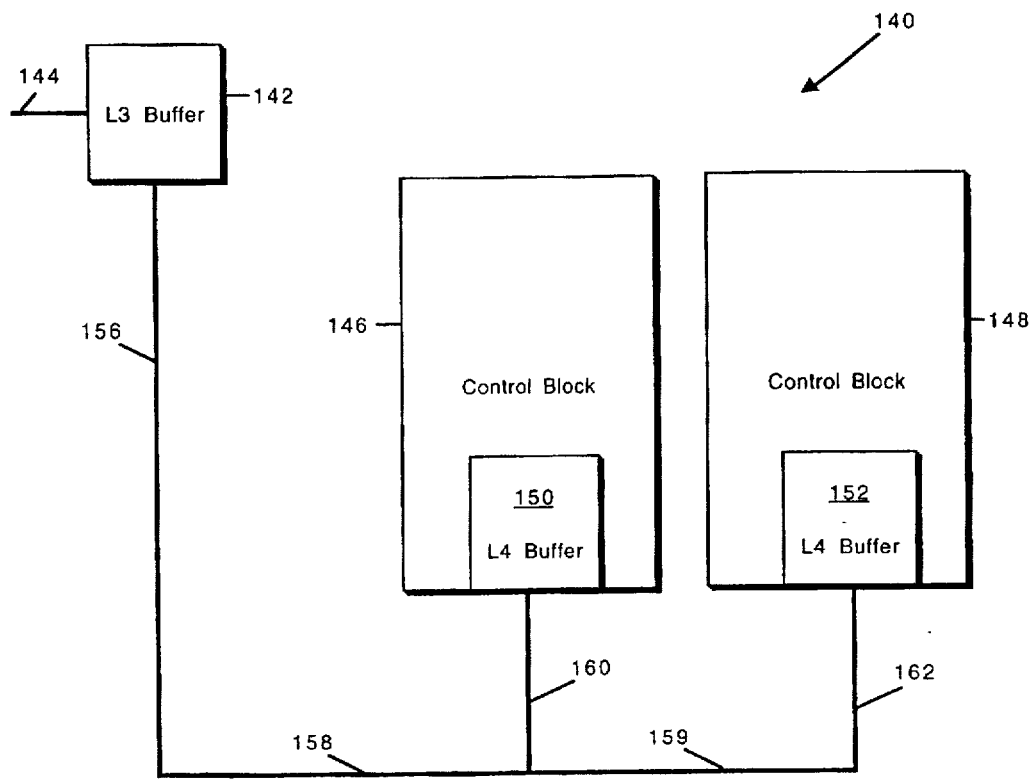
FIG. 2A is a block representation of a network segment having a direct routing line between clock buffers of adjacent stages of the network.
Figure 2B:
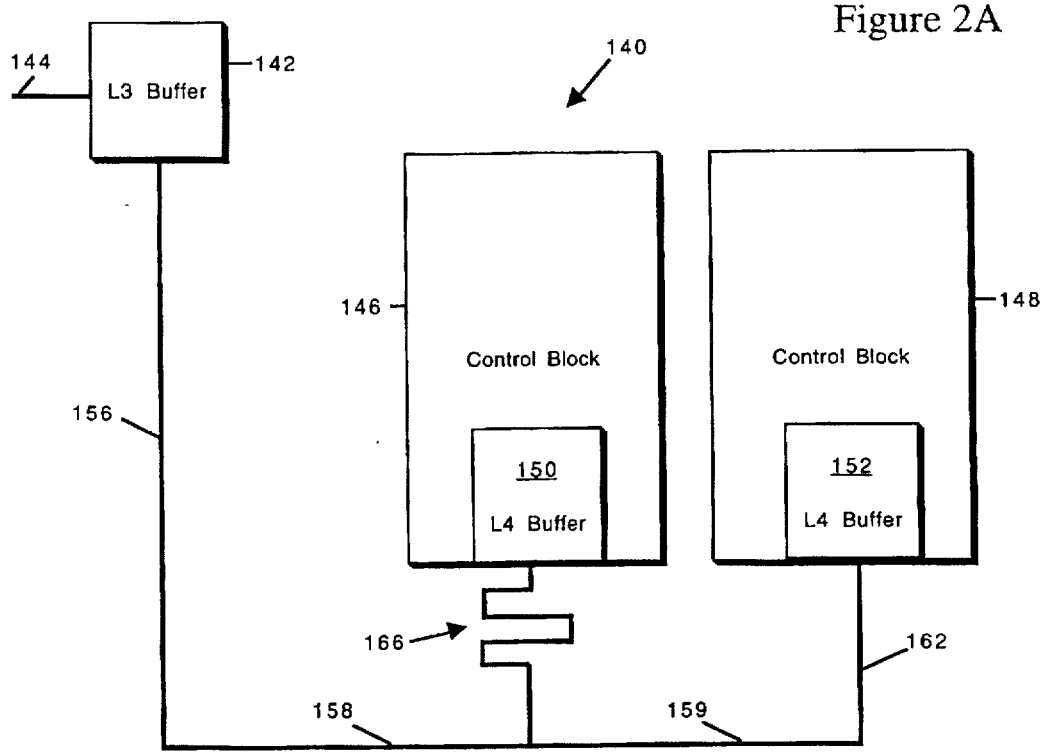
FIG. 2B is a block representation of the network segment shown in FIG. 2A, but with one of the direct routing lines being replaced with a serpentine section sized to reduce clock skew.

As noted above, the designer typically calculates the amount of additional wire length that must be added to any given wire connections in order to meet the skew budget at any particular stage. This may be accomplished by evaluating a design having buffers connected by direct routing as shown in FIG. 2A, for example. From such design, the designer first identifies the longest buffer connection route in the network. The wire length of this route is used to measure all other wire routes. For each other relevant wire route in the network, a difference is calculated between it and the longest wire length. This difference is then used by the system/method of the present invention to automatically generate a serpentine route of length equal to the difference.

The steps of (1) identifying the longest connection route and (2) calculating a length difference between the longest connection route and a connection under consideration may be performed either manually or automatically. If the steps are automated, they may be implemented as software together with the serpentine generating tools of this invention.

A method of routing wires between two buffers (e.g., L3 and L4 buffers) in accordance with a preferred embodiment of the present invention will now be described with reference to FIG. 4. The process begins at 200 and in a step 202 the system implementing the invention receives input design parameters for the wire routing. Such parameters may include any one or more of (1) the total length of wire required to minimize skew, (2) a serpentine separation distance "d", and (3) a serpentine routing height "h". The user may choose to not set some of these parameters such as the value of "h". In such instances, the system will automatically determine an appropriate height or other parameter. Typically, the user will need to specify at least the length of wire necessary and the locations of the buffer terminals.

After the input design parameters are accepted at step 202, a process step 204 identifies the L3 and L4 clock buffer terminals from this input data. Thereafter, a decision step 206 determines whether the terminals are actually facing one another. To promote efficient routing, it will generally be required that the terminals actually face one another. Thus, if decision step 206 is answered in the negative, a process step 208 ends the procedure and notifies the designer of the non-facing terminals. The process is then concluded at 232 as shown. At that point, it is incumbent upon the user to redesign the buffers so that their terminals face one another.

Assuming that the L3 and L4 buffer terminals are properly facing one another, a process step 210 then defines a "bounding box" having as corners the corners of the L3 and L4 buffers. Examples, of such bounding boxes will be described below with reference to FIGS. 7A through 7C.

After the bounding box has been defined at step 210, a process step 212 calculates a maximum length of serpentine wire that may be fixed within this bounding box. A decision step 214 then takes this value and determines whether it is greater than or equal to the specified wire length input at step 202. Remember that this specified length represents a required length for reducing or eliminating skew between the various L4 buffers. If the system determines that the maximum length of the serpentine is not greater than or equal to the desired wire length (at step 214), then the designer's criteria can not be met. Under these conditions, the system notifies the designer of the difference between the maximum length and the designer's specified length at a process step 216. The process may then be concluded at 232.

If, however, decision step 214 determines that the maximum length calculated for the serpentine in bounding box is greater than the desired length, a process step 218 then checks for obstructions within the bounding box. Such obstructions may constitute wires or other conductive structures at the same metallization layer as the L3–L4 buffer connection wire. If such obstructions exist, they must be accounted for and avoided because a serpentine routed within the bounding box could easily short with the structure constituting the obstruction. Therefore, a decision step 220 determines whether any obstructions have, in fact, been found within the bounding box. If so, a process step 222 redefines the bounding box to avoid such obstructions.

The maximum length of serpentine wire than can fit within a redefined bounding box must again be calculated at a step 224. From this value, the system determines whether the new maximum length is greater than or equal to the desired wire length at a decision step 226. If not, the designer is notified of the difference between the maximum length and the maximum length at step 216 as described above. Note that if the difference between the maximum length and the required length is quite short (and therefore constitutes only a very slight additional delay in signal propagation), the designer may simply elect to have the calculated maximum serpentine wire length be provided as suggested by the system.

If decision step 226 determines that the maximum length is in fact greater than or equal to the desired wire length or if decision step 220 determines that there are no obstructions from the bounding box, then a process step 228 calculates the area occupied by the serpentine wire route. Thereafter, a process step 230 draws that serpentine wire structure in the network connecting the chosen L3 and L4 clock buffers. The process is then completed at 232.

Note that in a typical rectangle bounding box it may be possible to produce two or more different serpentine layouts meeting the maximum length criteria. Generally, it will be desirable to choose the serpentine wire structure occupying the least amount of area. This frees up some surface on a given metallization layer to be used for routing purposes other than connecting L3 to L4 clock buffers. Thus in some embodiments, a separate process step may be employed to choose the serpentine wire structure occupying the least area.

Typically, the chosen serpentine wire structure will be drawn on a computer display screen running a program which displays the current design of an integrated circuit under development. The serpentine structure is then saved.

Note that many of the above recited steps are performed "automatically." This should be contrasted with the case in which the designer manually lays out the serpentine segments of each new wire route between stages. The present invention automates this procedure so that after the size of the wire length adjustment is specified, the system calculates a serpentine segment without significant user intervention. Other steps in the above procedure are also preferably, though not necessarily, automated. These steps include, for example, determining the maximum wire length that will fit within a bounding box and redefining the bounding box to avoid obstructions.

Figure 4:
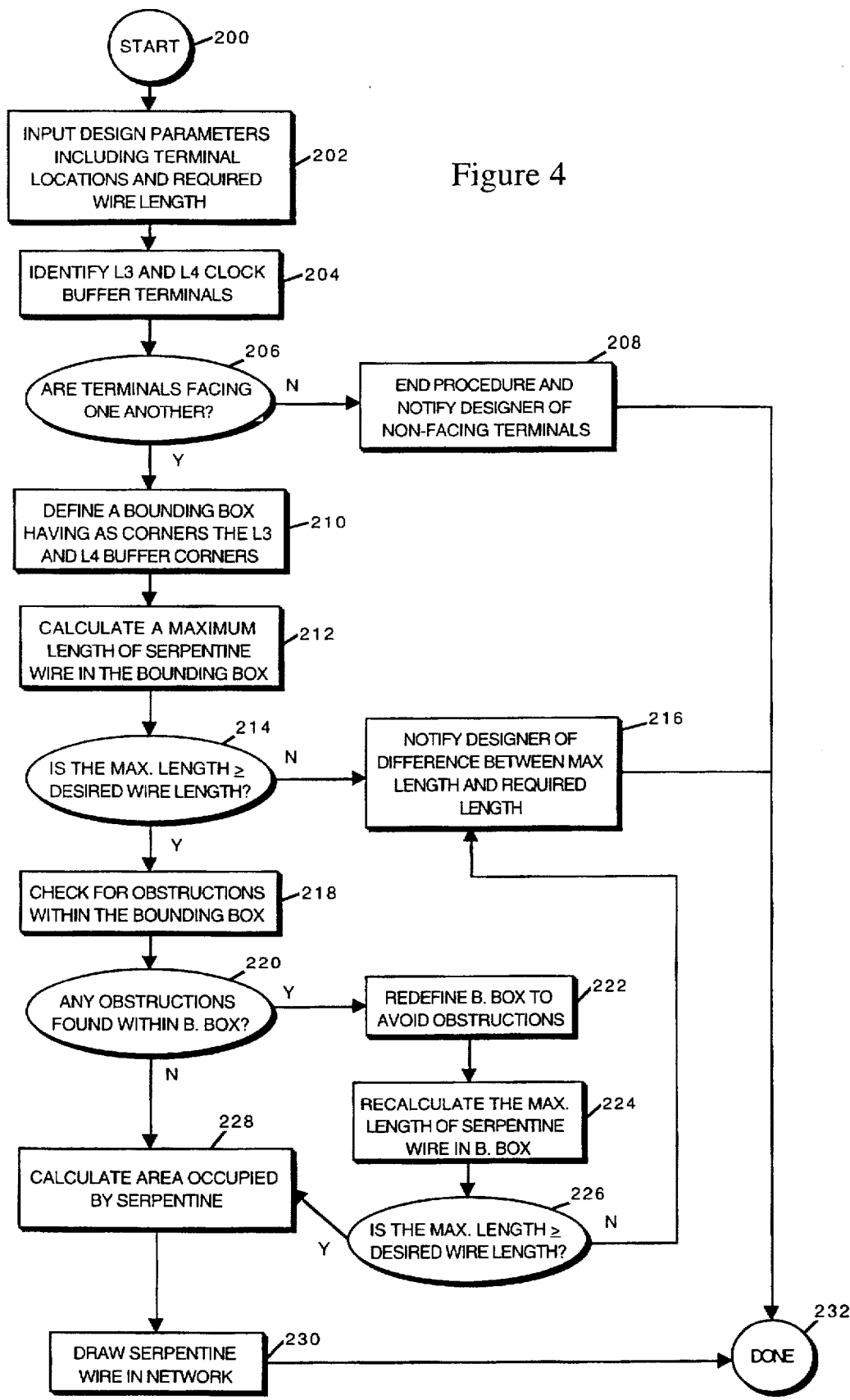
FIG. 4 is a process flow diagram of a preferred line routing method of the present invention.
Figure 5:
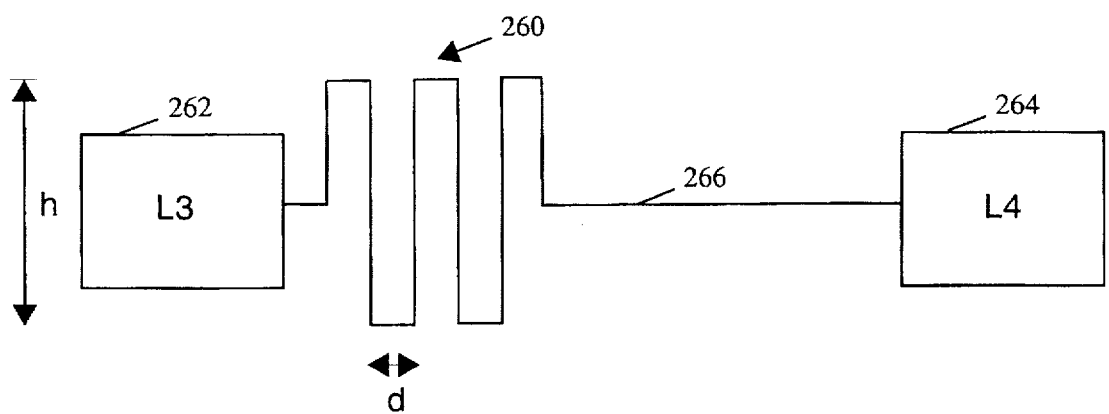
FIG. 5 is a block representation of an L3 clock buffer connected to an L4 clock buffer by an exemplary serpentine wire route produced in accordance with the present invention.

Referring now to FIG. 5, an exemplary serpentine structure 260 is shown for the purpose of defining some of the parameters input at step 202 described above in connection with FIG. 4. As shown, a line connects a L3 buffer 262 to L4 buffer 264. The wire includes the serpentine segment 260 together with a straight wire segment 266. The serpentine segment 260 may be characterized by a parameter "d" which is separation distance between two adjacent wire segments in the legs that make up serpentine structure 260. The value of d should be chosen so that the adjacent segments of wire making up serpentine section 260 do not unduly interfere with one another. For example, the separation distance d should be sufficiently great that capacitive effects are minimized.

In addition to separation distance d, the serpentine structure may be characterized by height or amplitude "h". As noted, the user may often leave the value of h unspecified, thereby allowing the system to define a value of h fitting within a bounding box between the L3 and L4 buffers. Preferably when the value of h is left to the process of this invention, it will choose a value of h that is as large as possible fitting within the bounding box.

As shown, serpentine segment 260 is located adjacent to L3 buffer 262. In one embodiment, the serpentine structure is placed at the first available location within a bounding box. The first available location is determined in this embodiment by starting at the L3 buffer and traversing toward the L4 buffer.

Figure 6:
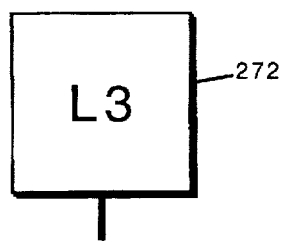
FIG. 6 is a block representation of a single L3 buffer and four L4 buffers having differing terminal orientations to show which orientations are suitable for use with the present invention.
Figure 6:
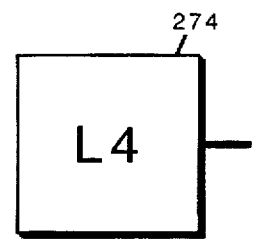
Figure 6:
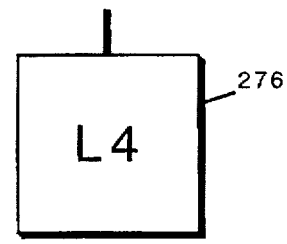
Figure 6:
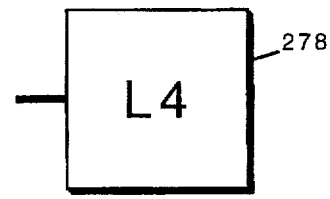
Figure 6:
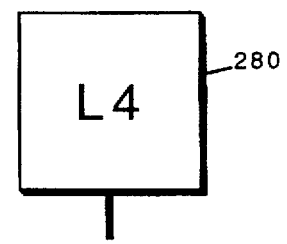

Turning now to FIG. 6, various terminal arrangements of L4 buffers with respect to an L3 buffer are shown. As noted above in connection with discussion of FIG. 4, the terminals of the L3 and L4 buffers must face one another in order for the process of generating a serpentine routing wire to be conducted (see steps 206 and 208). As shown in FIG. 6, an L3 buffer 272 includes a terminal facing downward in the page. An L4 buffer 274 located below and to the right of L3 buffer 272 includes a terminal directed to the right side. From inspecting the figure, it is apparent that the terminals of L3 buffer and L4 buffer 274 do not face one another. Therefore, under criteria of decision step 206, a design including these two terminals would not be acceptable for use with the routing tool of this invention.

Next, an L4 buffer 276 is located below and to the right of L3 buffer 272. In this case, the terminal of L4 buffer 276 faces upward. Thus, this terminal faces in the direction of L3 buffer 272, and a design including these two buffers would be found acceptable. Likewise, an L4 buffer 278 located below and to the right of L3 buffer 272 includes a terminal facing leftward, therefore would be found acceptable for routing in accordance with invention. Finally, an L4 buffer 280 (also located to the right and below L3 buffer 272) includes a terminal facing downward. Thus, the terminals of L3 buffer 272 and L4 280 do not face one another and would not be found acceptable by the criterial of step 206.

Figure 7A:
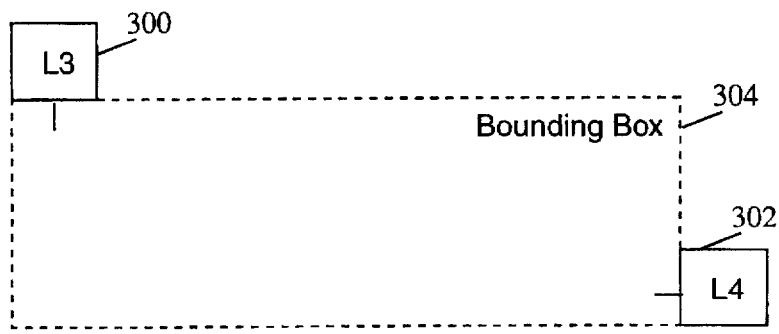
FIGS. 7A–7C are block diagrams depicting how bounding boxes may be formed and used to define routing paths in accordance with a preferred embodiment of the present invention.
Figure 7B:
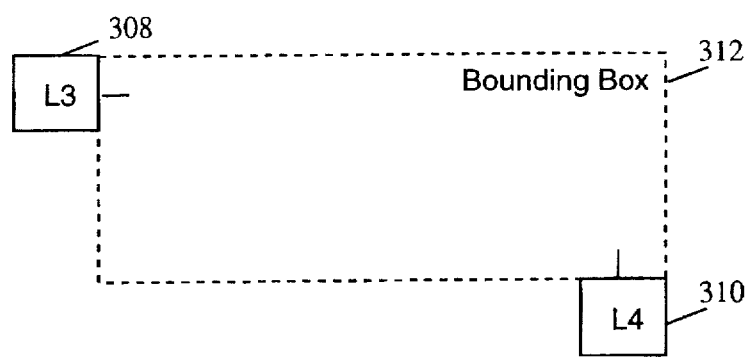

FIGS. 7A and 7B illustrate how a bounding box may be provided between L3 and L4 buffers in accordance with a preferred implementation of step 210 of FIG. 4. In FIG. 7A, an L3 buffer 300 includes a terminal facing downward. An L4 buffer 302 located to right and below L3 buffer 300 includes a terminal facing leftward. In accordance with a preferred embodiment of this invention, a rectangular bounding box 304 is defined by the bottom face of L3 buffer 300 and the left face of L4 buffer 302. In FIG. 7B, an L3 buffer 308 includes a terminal facing rightward and an L4 310 includes a terminal facing upward. A rectangular bounding box 312 preferably is defined by the right face of L3 buffer 308 and top face of L4 buffer 310. Note that the shape and size of the bounding box is determined by two factors: (1) the relative locations of the L3 and L4 buffers, and (2) the faces of these buffers on which terminals reside.

Figure 7C:
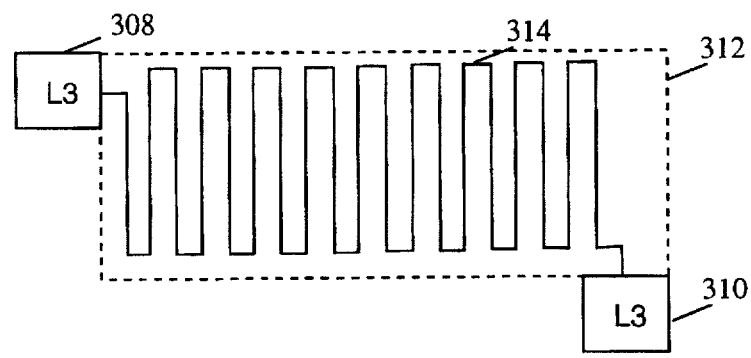

FIG. 7C illustrates how the system of this invention might provide a serpentine wire routing segment 314 within bounding box 312 and between the terminals of L3 buffer 308 and L4 buffer 310. As the serpentine wire routing segment 314 occupies all of bounding box 312 between the terminals of L3 buffer 308 and L4 310, this structure represents the "maximum" wire length that could fit between the buffers.

Figure 8A:
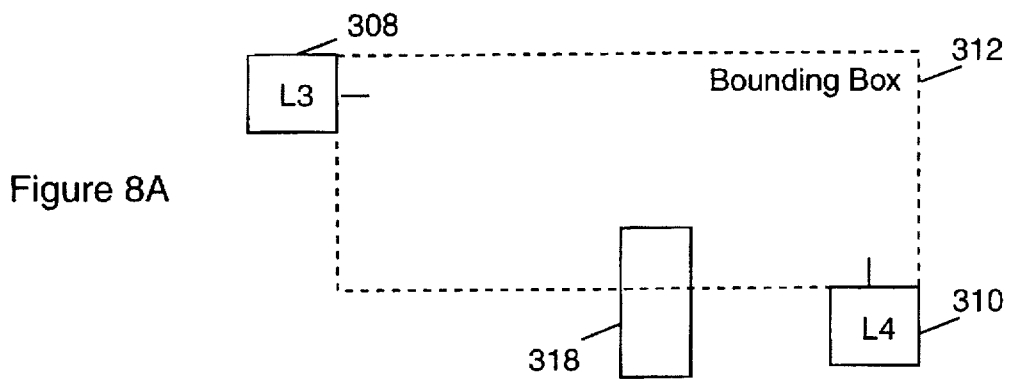
FIGS. 8A–8C are block diagrams depicting bounding boxes designed to avoid obstructions in potential wire routes between two clock buffers.
Figure 8B:
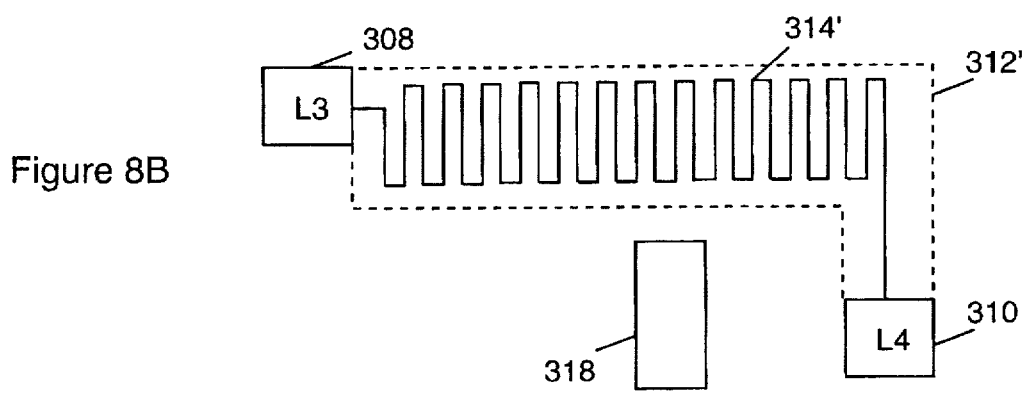

As noted in discussion of the FIG. 4 process, the system will check for any obstructions within bounding box 312. If such obstructions are found, a new bounding box must be generated to avoid the obstructions. As noted, an obstruction is defined as a conductive structure on the same layer as the connecting wire between the L3 and L4 buffers being connected. Also, as noted, it is necessary to define the bounding box around this obstruction so that short circuits are avoided. In the FIG. 8A, a metal obstruction is shown protruding into rectangular bounding box 312. As a result, the system of this invention may generate a modified bounding box 312' as shown in FIG. 8B to avoid obstruction 318. Note that bounding box 312' does not directly abut obstruction 318. Rather, there is a buffer region separating obstruction 318 from bounding box 312'. The size of such buffer regions will generally be dictated by the design rules applicable to the fabrication process.

After the modified bounding box 312' has been generated, the system provides a modified serpentine routing wire structure 314' which avoids obstruction 318. Notice in this example that the value of "h" is substantially smaller for structure 314' then for structure 314. Thus, the maximum wire length that can be generated will be less that the initially calculated value.

Figure 8C:
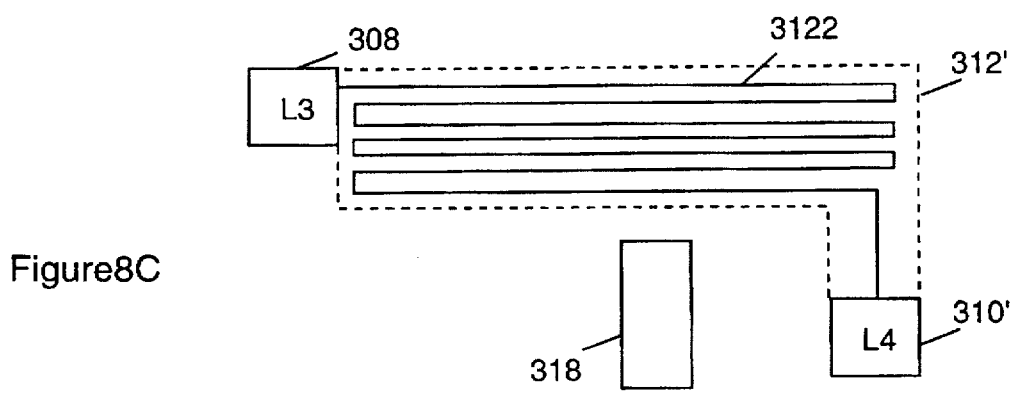

As noted above, in the discussion of FIG. 4 (particularly in discussion of step 228), the system of this invention may generate two or more serpentine structures meeting the wire length requirements. When this approach is taken, the system may determine which of the two serpentine occupies less area and then adopt that structure for the actual design output. FIG. 8C illustrates one such alternative serpentine structure 322 provided within bounding box 312'. As can be seen, the legs of 322 move in a horizontal direction, as opposed to the vertical direction of the legs in serpentine structures 314 and 314'. In this example, the areas are shown to be roughly the same. However, if less than the maximum amount of serpentine structure is necessary to provide the necessary wire length, the differences in occupied area can be significant.

While the above-described line routing tool may be employed to route lines between various network elements (e.g., L3 and L4 buffers in a clock distribution network), other techniques may also be employed to reduce skew in the network. As described below, one such technique chooses appropriate buffer types for placement at buffer locations specified by a standard place and route tool (to design a control block for example). Because the various buffer types have different signal propagation characteristics, skew can be controlled by providing appropriate buffer types at appropriate locations in the distribution network.

A preferred embodiment of present invention provides an automated process that generates buffer sizing data, in a tabulated format, relating to a first level (e.g., L4) and one or more second level (e.g., L5) buffer circuits that are part of a control block or other module in an integrated circuit such as a microprocessor. This tabulated buffer data is utilized in conjunction with other processes to assist the designer in determining the selection of circuit components and the coupling of these components in an integrated circuit.

Figure 13:
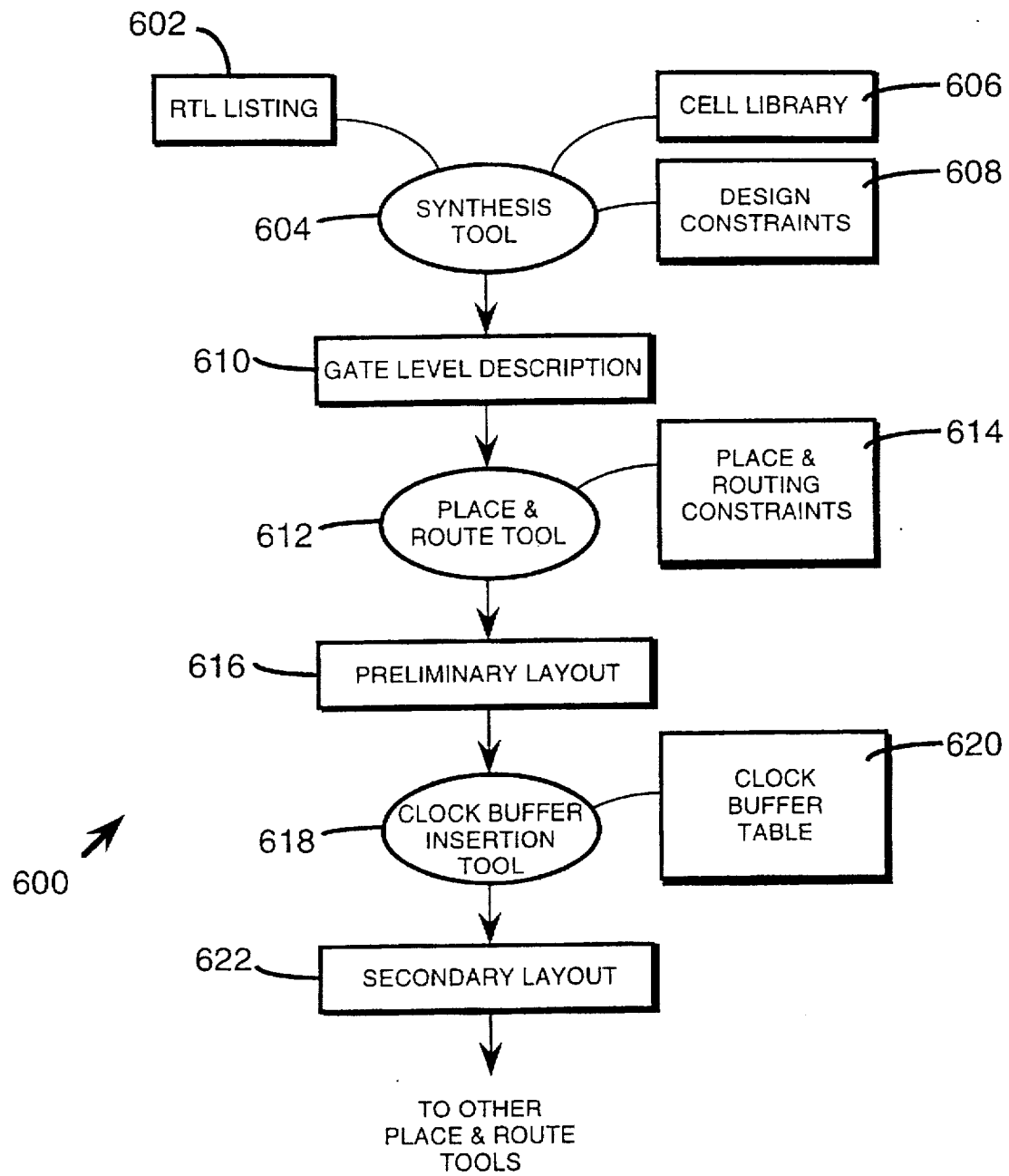
FIG. 13 is a partial process diagram depicting the particular steps of a typical integrated circuit design process.

To illustrate the role of such table in the design process, a partial integrated circuit design process 600 is shown in FIG. 13. The partial integrated circuit design process 600 includes some initial steps employed to produce a control block. The process typically includes supplying an initial RTL listing 602, associated with the logical construct of the logical circuits being designed, to a synthesis tool 604. Note that the RTL listing 602 can provide no physical or layout information because it is provided in a hardware design language such as Verilog.

The synthesis tool 604 considers the RTL listing 602 data along with a cell library 606 and a design constraints 608 to produce a gate level description 610. The cell library 606 contains various defined circuits such as logic gates used by synthesis tool 604 to implement the abstract RTL listing functions as concrete circuitry. Such cell libraries are widely used by enterprises responsible for designing integrated circuits. Design constraints are employed to specify which of the cells available in library 606 may be employed for the design task at hand. A suitable synthesis tool is the Synopsis Compiler produced by Synopsis, Inc. of Mountain View, Calif.

The gate level description 610 is a schematic representation of the block being designed. Aside from specifying how circuit elements are connected to one another, this description does not specify how circuit elements are to be laid out on a semiconductor die. To begin the layout process, gate level description 610 is supplied to a place and route tool 612, which considers any place and routing constraints 614 (provided by the designer) to produce a preliminary layout 616. A suitable place and route tool is the Arccell BV produced by Avanti of Sunnyvale, Calif. The preliminary layout specifies the locations of buffers in a signal distribution network, but does not specify which specific buffer types are to be employed in this region.

The preliminary layout 616 is supplied to a clock buffer insertion tool 618 which utilizes a clock buffer table 620 to produce a secondary layout 622. The clock buffer insertion tool 618 inserts appropriate clock buffers at the locations specified in the preliminary layout 616. Types of clock buffers are specified in table 620 for use under various sets of conditions. As explained in more detail below, those conditions pertain to the buffer's location in the signal distribution network. To choose the correct clock buffer, table 620 is consulted.

The secondary layout 622 contains all information relating to the clock distribution system in a particular control block being generated. Typically, the control block will specify the locations of L4 and L5 buffers. That secondary layout may be supplied to other design tools which integrate the control block with other integrated circuit modules.

The present invention provides an automated process for generating the clock buffer table 620 for use in the partial integrated circuit design process 600. Preferably, buffer table 620 specifies for each type of available L4 buffer circuit the range of line lengths over which that L4 buffer circuit may be used to drive a specified number of L5 buffer circuits.

FIG. 9 presents an example clock buffer table 620 produced in accordance with the present invention. As shown, the clock buffer table 620 provides columns specifying incrementally varying values of line length—which line lengths represent lines connecting a given L4 buffer to one or more L5 buffers. In the exemplary table shown in FIG. 9, the line lengths are specified in increments of 100 μm (e.g., the second column specifies L4 to L5 line lengths 100–199 μm). Of course, other incremental variations in line length may be specified in the columns of the table. Note that clock buffer table 620 is generated utilizing an assumption that the electrical characteristics of a conductive line will be sufficiently uniform for a given unit of line length. In more sophisticated versions, the table could account for lines of different current carrying characteristics.

As shown in the FIG. 9 table, the individual rows specify incrementally varying values of the number of L5 buffers driven by a given L4 buffer. For example, the first row specifies that the L4 buffer drives only a single L5 buffer, while the second row specifies that the L4 buffer drives two L5 buffers, the third row specifies that the L4 buffer drives three L5 buffers, etc.

Obviously, the number of L5 buffers driven by a given L4 buffer affects the propagation time between the L4 buffer and the L5 buffers. Thus, the ideal L4 buffer for minimizing skew at a location driving two L5 buffers would not necessarily be the ideal buffer at a location driving five L5 buffers. Likewise, the ideal L4 buffer for one line length would not necessary be the ideal L4 for a different L4 buffer.

As shown, clock buffer table 620 is populated with various L4 buffer types which are given arbitrary identifying names (e.g., 1X, 2X, 3X, 4X, 5X 6X, . . . ). Each buffer type represents a structurally different buffer. A given L4 buffer circuit type identified in a unique location of table 620 indicates that particular type has been determined to meet the skew budget for signal propagation. For a single driven L5 buffer circuit, a "1X" L4 buffer circuit may be used if the line length is between 100 and 399 μm, and alternatively a "2X" L4 buffer circuit may also be used if the line length is between 200 to 399 μm. For an L4 buffer to drive three L5 buffers over a line length of between 200 to 299 μm, a "3X", "4X", or "5X" type L4 buffer would be appropriate.

In situations where more than one type or size of L4 buffer circuit may be used the circuit designer may choose one from the tabulated listing of identified (i.e., acceptable) L4 buffer circuits. For example if three L5 buffer circuits need to be driven and the longest line length is about 150 μm then, according to the example in FIG. 9, the designer may choose to use from either the "3X", "4X", or "5X" types of L4 buffer circuits.

In a preferred embodiment, the table is provided with only a single preferred buffer circuit for each unique combination of line length and number of L5 buffers driven. Thus, if the system of this invention determines that multiple L4 buffers are appropriate for a given combination, then a designer or the system itself would select one of these multiple L4 buffers as the "best" L4 buffer and eliminate the other suitable L4 buffers from the table entry.

While the example shown in FIG. 9 shows line length and number of driven L5 buffers as parameters dictating selection of L4 buffers, there is in principle no reason why other skew-related parameters could not be employed in place of or in addition to these parameters. Further, such tables could be used to select circuit elements other than L4 buffers. L4 buffers were simply chosen because they are elements whose locations are fixed in signal distribution networks by place and route design tools. It should also be noted that the above examples assume that each L5 buffer presents an identical load to the L4 buffer. While this is the case in some designs, it not necessary and the present invention can be applied to such situations.

A buffer table such as clock buffer table 620 is generated by modeling the signal propagation characteristics of L4 buffers in the context of line lengths connecting the L4 and L5 buffers and the number of L5 buffers driven by the L4 buffer. The modeled signal propagation characteristics are compared with acceptable skew limitations. These limitations are preferably expressed in terms of signal propagation delays from logical low to logical high and from logical high to logical low. In addition, the modeled signal may be required to meet other criteria such as having the rise and fall times of less than a defined maximum, etc. Preferably, the modeling is conducted with a circuit analysis tool such as HSPICE.

Conventionally, a designer generates each entry in a buffer table such as table 620 by running HSPICE for various L4 buffer types under the conditions specified by the table entry under consideration. Ultimately, one or more L4 buffers meeting the design criteria are identified for each table entry. Not surprisingly, this is a time consuming and tedious process. As noted, the present invention improves on this procedure by automating table generation.

Figure 10A:
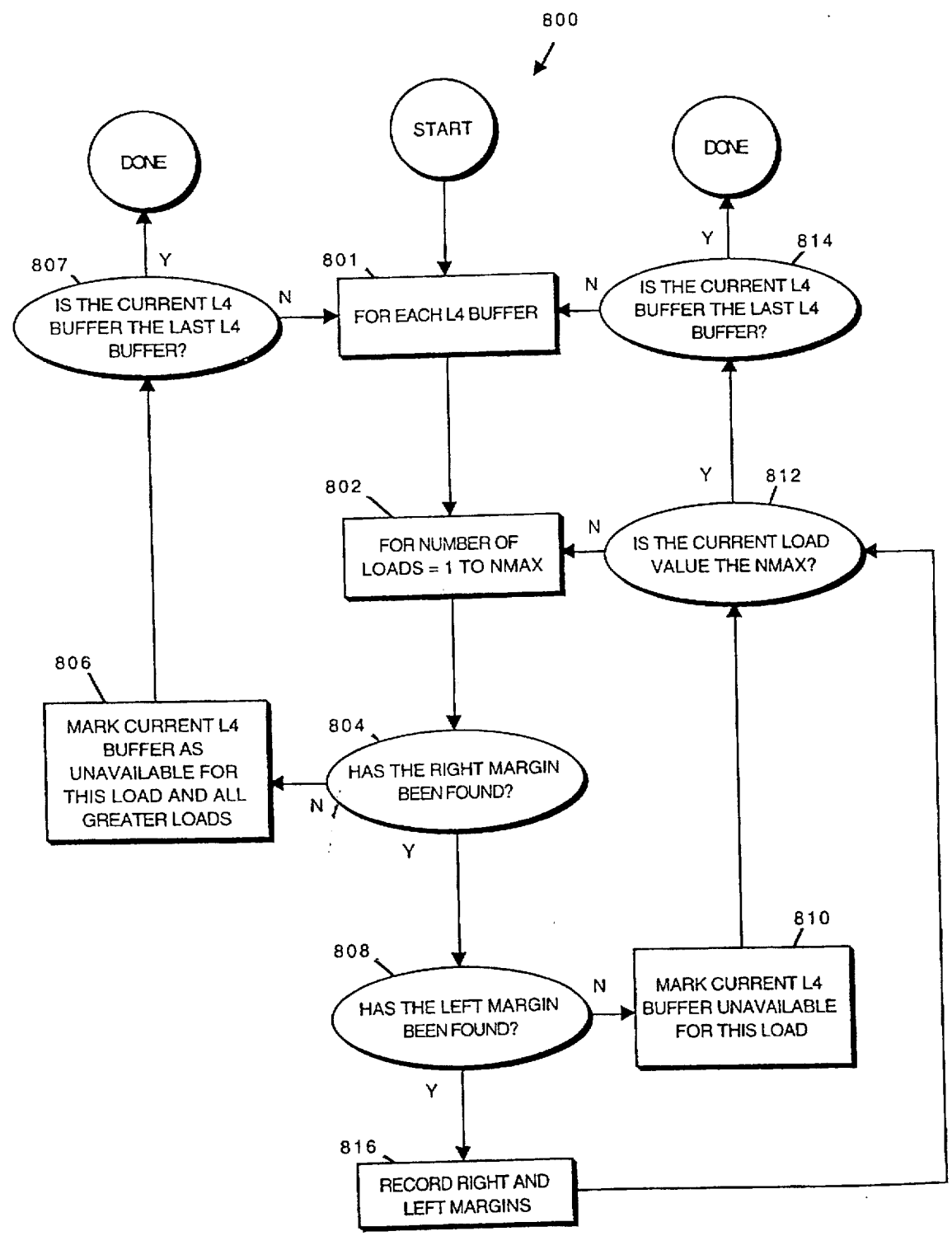
FIGS. 10a–10c are process diagrams of the method for generating buffer circuit sizing data.

FIG. 10a is a process flow diagram depicting the steps associated with automatically generating buffer circuit sizing data in accordance with a preferred embodiment of this invention. A buffer data generating process 800 preferably is part of a computer implemented program of instructions. As depicted, the buffer sizing data generating process 800 is preferably an iterative process that may be embodied in a set of computer instructions, or software instructions, for use in a computer system, or may be embodied in a hardware circuit configuration, or a combination thereof. The buffer sizing data generating process 800 is iterated at steps 801 and 802 to specify respectively the type of L4 buffer circuit and the number of L5 buffer circuits to be driven (given by the variable "n"). Steps 804 and 808 iteratively specify the line lengths, or ranges of line lengths, connecting the L4 and L5 buffer circuits. These iterative steps will be detailed below with reference to FIGS. 10b and 10c.

Figure 10B:
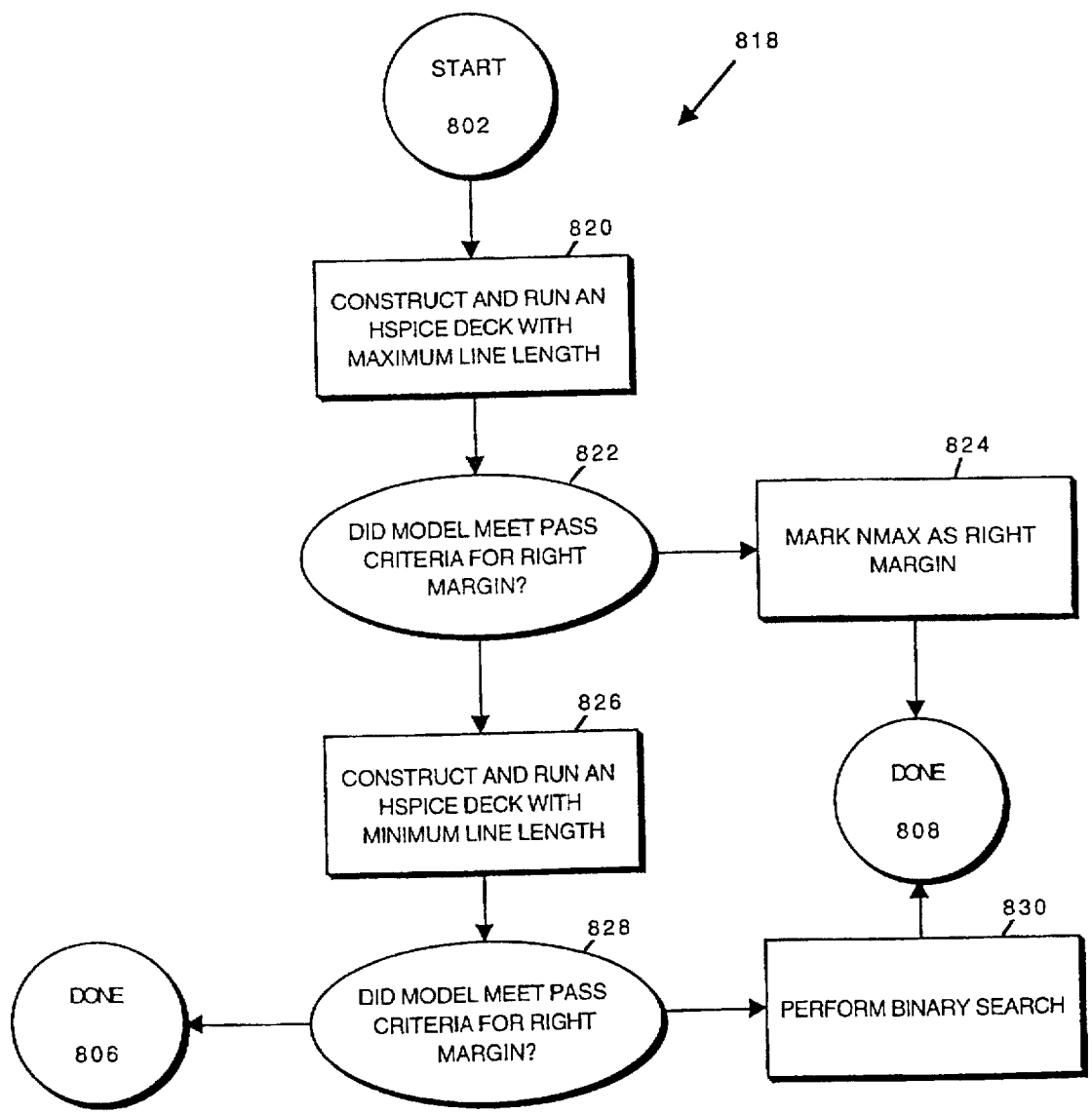
Figure 10C:
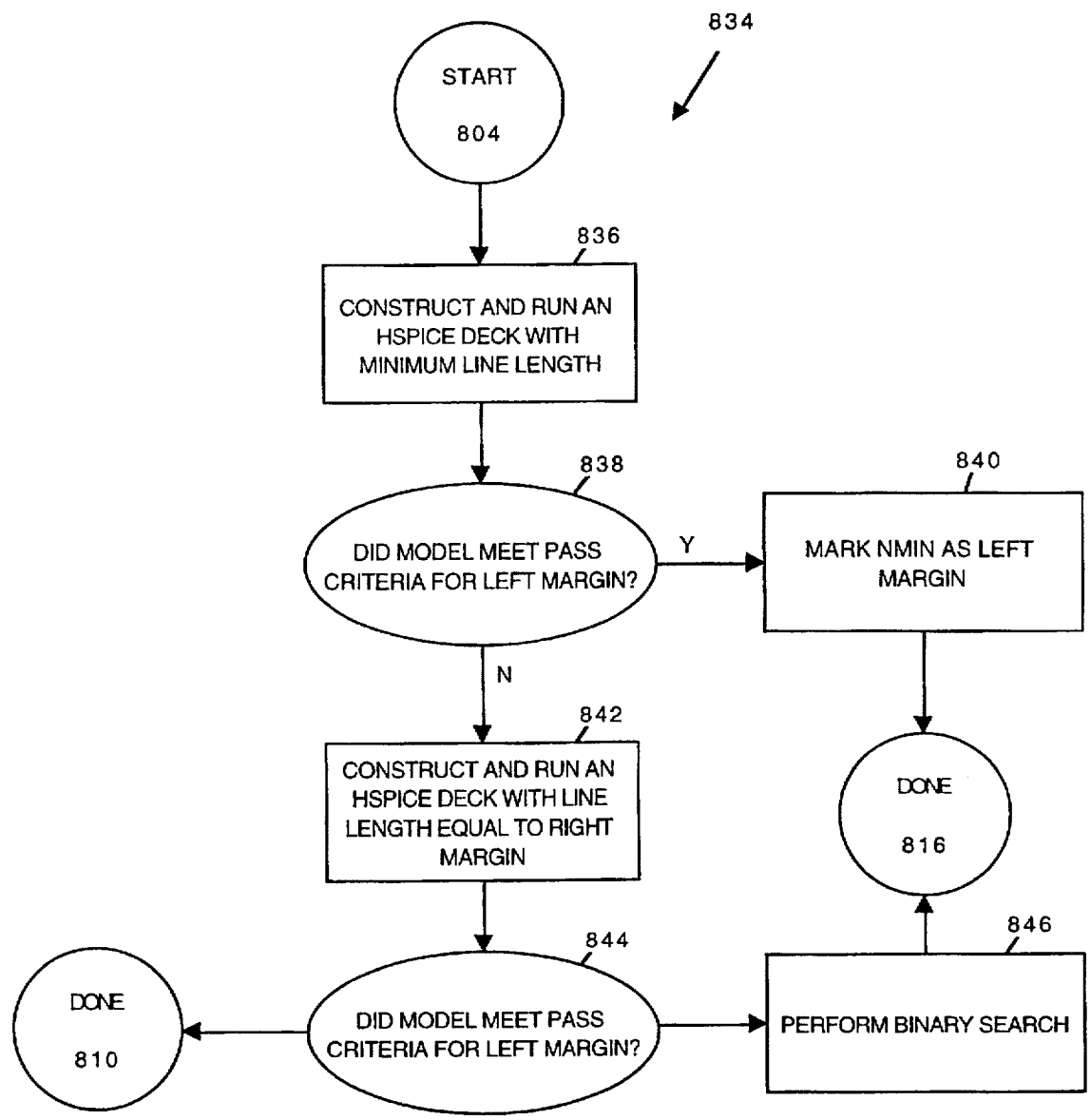

Preferably, the computer system for implementing the process of FIGS. 10a–10c (including software, firmware, and/or hardware) includes at least two components. First, it will include some form of input interface for accepting the various inputs required to execute the process of FIGS. 10a–10c. Such inputs may include, for example, the performance criteria, buffer table parameters such as incremental line lengths, etc. In addition, the system will require a computational module for executing the procedures recited in FIGS. 10a–10c (e.g., iterations, binary searching, and calculations). These two elements may be provided as separate modules or be integrated into a single module at the option of the designer.

The present invention utilizes the electronic characteristics of a specified collection of available L4 and L5 buffer circuits and the electrical characteristics of a conductive line used to couple the L4 buffer circuits to an L5 buffer circuit. The conductive line may be a wire, a via, a channel, or other suitable electrical connection consisting of a metal or other suitable conductive or semiconductor material. In a preferred embodiment, the electrical characteristics, such as the resistance and capacitance of the conductive line, are based on a given measured unit of line length. In other embodiments, such electrical characteristics may also be based on other units of measurement, such as depth, width, surface area, and even volume.

For each of the available L4 buffer circuits, the process automatically generates buffer sizing data which specifies the number of L5 buffer circuits capable of being driven by a selected L4 buffer circuit over a specified range of line lengths in accordance with the skew budget's limitations (see table 620 for example).

In order to expedite the process of populating a table, a right margin and a left margin within a given row of the table may be determined for each type of L4 buffer circuit. The right margin represents the maximum acceptable line length from the output of the L4 buffer circuit to the input of the most distant L5 buffer circuit. The right margin is determined from a comparison of the modeled signal propagation delays with specified maximum signal propagation characteristics. The right-most line length at which modeled delay meets the maximum propagation characteristics constitutes the right margin. Conversely, the left margin is the minimum acceptable line length from the output of the L4 buffer circuit to the input of the closest L5 buffer circuit. The left margin is determined from a comparison of the modeled signal propagation delays with specified minimum signal propagation characteristics.

Following steps 801 and 802 (which specify a type of L4 buffer circuit and a specific number of L5 buffer circuits), the system determines whether the right margin has been found at a decision step 804. Step 804 will be described in more detail below with reference to FIG. 10b. For now, it is sufficient to understand that this step includes a computer automated process that composes and runs a test layout of the conductive means and the L4 and L5 buffer circuits. The test layout includes the number of L5 buffers driven by the L4 buffer as well as the wire length connecting the L4 buffer to the L5 buffers.

If no right margin has been found (that is step 804 has been answered in the negative), a step 806 will then record that no right or left margin exists for the selected row (i.e., there are no line lengths over which the L4 buffer circuit can successfully drive the specified number of L5 buffer circuits). At this point, it can be assumed that the L4 buffer under consideration will not work for any value of n (the number of L5 buffers) greater than the current value. This is because the additional load supplied by more L5 buffers will further slow the propagation delay. Because no line length was short enough to meet a maximum propagation delay required (as indicated by the failure to find a right margin), then all cases having additional L5 buffers will likewise not have a sufficiently short line length. As a result, it can be assumed that no right margin will be found for any value of n greater than the current value. Thus, step 806 marks the current L4 buffer as unusable for not only the current value of n but all greater values of n as well. From step 806, a decision step 807 determines whether the current L4 buffer is the last L4 buffer to be considered in the process 800. If process is complete. If not, process control returns to step 801 where the next L4 buffer is considered.

If a right margin has been found (i.e., step 804 is answered in the affirmative) the process proceeds to a decision step 808 which performs a similar function to step 804. Specifically, decision step 808 determines whether the system has found a left margin. This step is implemented as a computer automated process that composes and runs a test schematic directed for finding the left margin. As noted, the left margin represents the minimum line length that will have a sufficiently long propagation delay to meet the desired skew budget. The process of determining whether the left margin exists (and if so where) will be discussed in more detail below with reference to FIG. 10c.

If it is determined at step 808 that no left margin exists for the current values of L4 and n, a process step 810 marks the current L4 buffer as unusable for the current value of n. Thereafter, a decision step 812 determines whether the current value of n is equal to the maximum value of n (nmax) for the buffer data being generated. If not, process control is then returned to step 802 where the value of n is incremented by 1. If so, the next type of L4 buffer (if any) must be considered. Therefore, if step 812 is answered in the affirmative, a decision step 814 then determines whether the current L4 buffer is the last L4 buffer that needs to be considered. If so, the process is completed. If not, process control returns to step 801 where the next L4 buffer is considered.

If decision step 808 determines that a left margin has been located, process control is directed to step 816 where both the left and right margins are recorded for the selected row. Also, in this case, any column cells (i.e., line lengths) between the left margin and the right margin will be recorded as being acceptable for the selected row (i.e., the specified L4 buffer circuit is capable of driving the specified number of L5 buffer circuits for all line lengths between the left and right margins). Thus, at this point in the buffer sizing data generating process 800, the analysis for the selected row (i.e., number of L5 buffer circuits) has been completed and the acceptable line lengths have been identified. After the margins have been recorded at step 816, process control is directed to step 812, where the process continues as described above.

Those skilled in the art will recognize that several known searching and programming schemes may be incorporated into the buffer sizing data generating process 800 to produce or increase throughput and efficiency of the process. In a preferred embodiment, the process includes a binary searching algorithm and a routine to merge the tables created for several different type or size of L4 buffer circuits into a single, unified table. The individual or merged tables may be formatted and supplied to other programs and tools associated with integrated circuit design (as described above). Of course, the generated buffer sizing data also may be displayed on computer displays or printed via computer terminals connected to printers. It is also recognized that the present invention may be adapted to produce a three dimensional table which includes different types of L5 buffer circuits as well. One logical extension is the use of process 800 to generate three dimensional tables including different types of L5 buffer. The above description assumes that all L5 buffers have the same propagation characteristics.

As noted a binary search algorithm may be employed to identify the right and left margins, if any. As recognized by those skilled in the art, a basic binary searching algorithm iteratively halves or otherwise bisects the search field or data set until the targeted data is located, or isolated/excluded from the set. Such algorithm will require at most log2(n) tries to find a margin from n options. While a binary search algorithm is not necessary to the practice of this invention, in those embodiments in which such search algorithm is employed, it may be implemented as follows.

A process 818 of determining whether a left margin exists, and if so where, will described with reference to FIG. 10b. Note that this process corresponds to step 804 in FIG. 10a. The process begins after step 802 (FIG. 10a) and at a step 820, the system generates and runs a model (preferably provided as a SPICE deck) including the L4 buffer currently under consideration connected to a specified number of L5 buffers (step 802 of FIG. 10a). In the model, the L4 buffer is connected to the L5 buffers by a line length equal to the maximum value of line length in table 620.

After the model has been run, a step 822 determines whether the modeled system meets the criteria for the right margin. If so, the right margin is noted to be the largest line length available in table 620 at a step 824. The search process 818 is complete at this point, with process control being directed to step 808 in process 800.

If the model system generated and run at step 820 fails the test (i.e., step 822 indicates failure), a process step 826 generates and runs a model including the current L4 buffer connected to the current number of L5 buffers by a line length equal to the minimum value of line length in table 620. The result of the model run is then compared with the pass criteria at a decision step 828. If the model fails, then it can be assumed that the no right or left margins exist for the currently modeled values of L4 and number of driven L5 buffers. Thus, if step 828 indicates failure, process 818 is complete with process control being directed to step 806 of process 800.

Finally, if step 828 indicates that the minimum value of line length produced a passing circuit arrangement, the right margin must lie either at the minimum line length or somewhere between the minimum and maximum line lengths. To expeditiously located the right margin, a process step 830 performs a binary search to locate the right margin. Once that margin is located, the process 818 is completed with process control being handed off to step 808 of process 800.

If a binary search is performed as specified in step 830, it preferably proceeds as follows. First, the middle line length between the leftmost and rightmost line lengths is tested. If it passes, then a new line length is chosen midway between the middle and longest line lengths. If it does not pass, then a new line length is chosen midway between the middle and shortest line lengths. The search algorithm continues bisecting in this manner until a right margin is unambiguously identified.

In the flow chart shown in FIG. 10b, steps 822 and 828 determine whether the right margin has been located for a given L4 buffer type. As part of that inquiry, the table generation tool determines whether the L4/L5 buffers combination meets certain signal propagation characteristics. In a preferred embodiment, these criteria include the following: (1) the maximum propagation delay from low to high, (2) the maximum propagation delay from high to low, (3) the maximum rise time and (4) the maximum fall time. Specifically, the low to high propagation delay from the L4 input to the L5 input must be less than the maximum delay from low to high. Similarly, the high to low propagation delay between the same two points must be less than the maximum delay from high to low. Further, the output from the L4 buffer must have a rise time that is no greater than a predefined maximum. Similarly, the output of the L4 buffer must have a fall time that is no greater than a predefined maximum. In one specific embodiment, the maximum rise and fall times are set at about 240 picoseconds.

The low to the high and high to low propagation delays are illustrated in FIG. 3. As shown in that figure, a waveform L4a1 is presented at the input of the L4 buffer under consideration. A waveform L5a1 is presented at the input of the L5 buffer receiving the output from the L4 buffer under consideration. Initially, the signal is low, and then undergoes a transition to the high state at R5. As shown in FIG. 3, the distance between R5 and R7 constitutes the propagation delay for the low to high transition of the L4 buffer under consideration. After the low to high transition, the signal at the input of the L4 buffer undergoes a high to low transition at F5. Similarly, the corresponding transition in signal L5a1 occurs F7. The time delay between points F5 and F7 constitutes the high to low propagation delay of the clock signal. As mentioned, to find the right margin of the L4 buffer as indicated at step 804 of FIG. 7a, the L4 buffer under consideration must have a low to high delay that is less than a defined maximum and it must also have high to low delay that is less than another maximum value. In a specific embodiment, the maximum value of the low to high delay and high to low delay is on the order of a few hundred picoseconds.

As indicated in FIG. 10a, a decision step 808 determines whether the left margin of the L4 buffer table has been identified. The criteria employed to make this determination are very similar to those employed to identify the right margin. Again, the rise and fall times of the signal output by the L4 buffer must be no greater than predefined maximum values. Typically, those maximum values will be the same as are employed located to the right margin. In addition, the low to high propagation delay and high to low propagation delay are employed to identify the left margin. However, rather than specifying that these delays be below a specific maximum, it is required that the delays be above a specified minimum. Thus, some propagation delays may be too small to meet the criteria required to identify the left margin. In one specific embodiment, the minimum low to high delay and high to low delay is set at a few hundred picoseconds (but at lower values than the corresponding maximum propagation delays).

Figure 11:
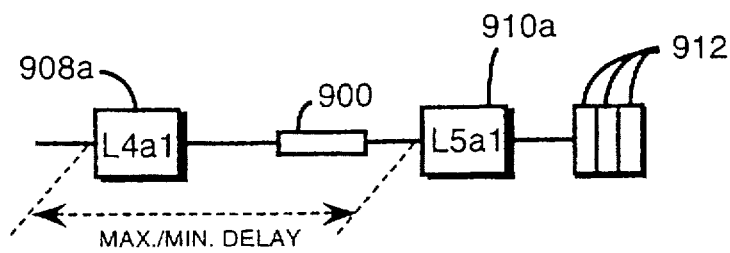
FIG. 11 depicts a representative circuit modeling approach for determining the propagation delays for a single L5 buffer circuit.
Figure 12:
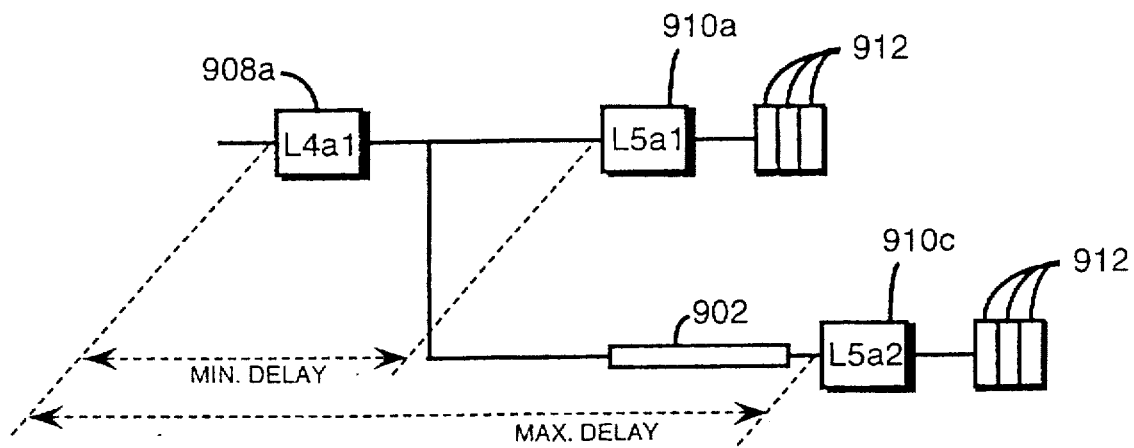
FIG. 12 depicts a representative circuit modeling approach for determining the propagation delays for multiple L5 buffer circuits.

To illustrate a preferred circuit modeling approach for identifying the right margin, FIGS. 11 and 12 depict, respectively, circuit models used to predict signal propagation delays between an L4 buffer circuit and a single L5 buffer circuit, and an L4 buffer circuit and a plurality of L5 buffer circuits. Preferably both of these modeling approaches are embodied in step 804. Such modeling approaches are based on an assumption that the electrical characteristics of the conductive mediums are reasonably uniform over the range of line lengths being modeled.

In FIG. 11, an L4a1 buffer circuit 908a is coupled to receive an input signal from a previous level circuit (not shown), and to supply an output signal to a single L5a1 buffer circuit 910a through a conductive means represented by an RC mega-wire 900. The RC mega-wire 900 possesses the electrical characteristics of the conductive means coupling the output of L4a1 buffer circuit 908a to the input of the L5a1 buffer circuit 910a. The electrical characteristics of the RC mega-wire 900 include the wire's resistance and capacitance. In more sophisticated models, the wire's inductance or other properties may be included.

As depicted in FIG. 11, there is essentially a single delay time as measured from the input of the L4a1 buffer circuit 908a to the input of the L5a1 buffer circuit 910a. Note, that the delay times may be slightly different for a signal transitioning from a logical low to a logical high, versus a signal transitioning from a logical high to a logical low. However for illustration purposes each of these will be considered to be the approximately the same.

FIG. 12 illustrates preferred modeling approaches for measuring signal propagation delays in a circuit configuration having an L4 buffer circuit driving at least two L5 buffer circuits. As depicted, the circuit is essentially the same as that shown in FIG. 11 with the exception of an additional conductive means between the output of the L4a1 buffer circuit 908a and the input of an L5a2 buffer circuit 910b; represented by a longer-delay RC mega-wire 902.

As with the model circuit shown in FIG. 11, the model circuit in FIG. 12 includes a signal propagation delay from the input of the L4a1 buffer circuit 908a to the input of the L5a1 buffer circuit 910a. The delay over this path (generally from the input of the L4 buffer to the input of the closest L5 buffer) is used to find the right margin. The signal propagation delay for purposes of finding the left margin, however, now exists between the input of the L4a1 buffer circuit 908a and the input of the L5a2 buffer circuit 910b as a result of the electrical characteristics associated with the longer-delay RC mega-wire 902. Generally, the left margin is identified by evaluating the signals at the input to the L4 buffer and the input to the second closest L5 buffer.

Thus, while the electrical characteristics of the connection between the line connecting the L4 buffer 908a to the closest L5 buffer 910a and of the longer-delay RC mega-wire 902 may be essentially equal, the line length of the longer-delay RC mega-wire 902 may be significantly greater than the line length of the RC mega-wire 900. This additional line length may be sufficient to cause greater signal propagation delays. This is particularly true for integrated circuits, wherein the dimensions of the circuit components and the line lengths of the conductive means are usually extremely small and wherein the propagating signals often transition between logical states millions of times each second. Note that in calculating left margin for the case of multiple L5 buffers, variation in the length of mega-wire 902 is used as the model variable to find the left margin.

A process 834 for identifying the left margin will now be described with reference to FIG. 10c. Note that this process corresponds to step 808 in FIG. 10a. The process begins after step 804 (FIG. 10a) and at a step 836, the system generates and runs a model (preferably provided as an HSPICE deck) including the L4 buffer currently under consideration connected to a specified number of L5 buffers (step 802 of FIG. 10a). In the model, the L4 buffer is connected to the L5 buffers by a line length equal to the minimum value of line length in table 620. Thus, while the method of finding a right margin starts by modeling the maximum line length, the method of finding a left margin starts by modeling the minimum line length.

After the model has been run, a step 838 determines whether the modeled system meets the criteria for the left margin. If so, the left margin is noted to be the largest line length available in table 620 at a step 840. The search process 834 is complete at this point, with process control being directed to step 816 in process 800.

If the model system generated and run at step 836 fails the test (i.e., step 838 indicates failure), a process step 842 generates and runs a model including the current L4 buffer connected to the current number of L5 buffers by a line length equal to the value of right margin line length as determined in process 818. The result of the model run is then compared with the pass criteria at a decision step 844. If the model fails, then it can be assumed that the no left margin exists for the currently modeled values of L4 and number of driven L5 buffers. Thus if step 844 indicates failure, process 834 is complete with process control being directed to step 810 of process 800 (i.e., there is no line length which can be used with the current L4 buffer to drive the specified number of L5 buffers).

Finally, if step 844 indicates that the right margin value of line length produced a passing circuit arrangement, the left margin must lie either at the right margin line length or somewhere between the minimum and right margin line lengths. To expeditiously located the left margin, a process step 846 performs a binary search to locate the left margin. Once that margin is located, the process 834 is completed with process control being handed off to step 816 of process 800.

If a binary search is performed as specified in step 846, it preferably proceeds as described above with respect to step 830 of process 818 (FIG. 10b). Thus, the search algorithm continues bisecting the line distance between the most recently located passing and failing line lengths until a left margin is unambiguously identified.

Although the foregoing invention has been described in some detail for purposes of clarity of understanding, it will be apparent that certain changes and modifications may be practiced within the scope of the appended claims. For instance, although the specification has described using a serpentine structure to generate additional wire length, other structures may be employed with similar benefit. In addition, the reader will understand that the method described herein can be used in many line routing applications other than clock network wiring in microprocessor designs. For example, the method here taught may be used to route lines connecting any number of circuit elements in gate arrays if skew control is necessary.

What is claimed is:

1. In a computer system for specifying an integrated circuit design, a method of laying out a path of a routing wire in the integrated circuit design, the method comprising the following steps:

receiving a value specifying a wire length that must be provided between terminals of two integrated circuit elements in said design;

defining a routing region in which the wire can be routed; and automatically specifying a wire route within said routing region for connecting said terminals, said wire route having at least one serpentine section with one or more legs as needed so that the wire route has the specified wire length.

2. The method of claim 1, wherein the two integrated circuit elements are two clock buffers in a clock distribution network.

3. The method of claim 2, wherein the two clock buffers are provided in separate and adjacent stages of the clock distribution network.

4. The method of claim 3, wherein the two clock buffers are provided in third and fourth stages of the clock distribution network.

5. The method of claim 1, wherein the value specifying a wire length is input by a user.

6. The method of claim 1, wherein the value specifying the wire length is chosen to minimize skew between integrated circuit elements in adjacent stages of the integrated circuit design.

7. The method of claim 1, wherein the step of defining a routing region in which the wire can be routed includes the following steps:

identifying locations of the terminals of the two integrated circuit elements; and defining a rectangular bounding box having its corners proximate the locations of the terminals.

8. The method of claim 1, further comprising a step of receiving one or more parameters defining the serpentine section's shape.

9. The method of claim 1, wherein the step of specifying a wire route specifies that the serpentine section is located proximate one of said integrated circuit elements.

10. The method of claim 1, further comprising the following steps:

determining a maximum wire length that can be provided in the wire route including the serpentine section;

determining if the maximum wire length is less than the value specifying the wire length that must be provided between the terminals; and if the maximum wire length is less than the value specifying the wire length that must be provided between the terminals, outputting a message specifying the difference between the maximum wire length and the value specifying the wire length.

11. The method of claim 1, wherein the specified wire route is located on a single metallization layer.

12. The method of claim 11, further comprising the following steps:

determining whether the routing region contains any obstructions that would prevent wire from being routed through or adjacent to such obstructions; and if the routing region does contain one or more such obstructions, redefining the routing region to avoid such obstructions.

13. A computer system for specifying an integrated circuit design and generating a wire connection between terminals of two integrated circuit elements in said integrated circuit design, the computer system comprising:

a design tool for representing a layout of features of said integrated circuit design; and a routing tool which can automatically specify a wire route of specified wire length for connecting said terminals, said wire route having at least one serpentine section with one or more legs so that the wire route has the specified length.

14. The computer system of claim 13, wherein the integrated circuit elements are two clock buffers in a clock distribution network.

15. The computer system of claim 14, wherein one of the clock buffers is provided in a third stage of the clock distribution network, and wherein the other clock buffer is provided in a fourth stage of the clock distribution network.

16. The computer system of claim 13, wherein the routing tool defines a bounding box having two corners proximate the locations of the terminals, and wherein the routing tool defines said wire route to be enclosed by said bounding box.

17. The computer system of claim 16, wherein the routing tool defines the bounding box to avoid any obstructions that would prevent wire from being routed through such obstructions.

18. The computer system of claim 13, further comprising a display screen and a graphical user interface which can display said integrated circuit design and said wire route in response to specified user inputs.

19. The computer system of claim 13, wherein the specified wire length is input by a user.

20. A computer system for specifying an integrated circuit design and generating a wire connection between terminals of two integrated circuit elements in said integrated circuit design, the computer system comprising:

a design tool for representing a layout of features of said integrated circuit design; and a routing tool which can automatically specify a wire route of specified wire length for connecting said terminals, said wire route having at least one serpentine section with one or more legs, wherein the specified wire length is a length of wire determined to be necessary to reduce skew between multiple circuit elements at the same stage in the integrated circuit design.

21. A computer readable medium storing program instructions for controlling the operation of a computer system for specifying an integrated circuit design, the program instructions specifying a method of laying out a path of a routing wire in the integrated circuit design, the method comprising the following steps:

receiving a value specifying a wire length that must be provided between terminals of two integrated circuit elements in said design;

defining a routing region in which the wire can be routed; and automatically specifying a wire route within said routing region for connecting said terminals, said wire route having at least one serpentine section with one or more legs as needed so that the wire route has the specified wire length.

22. The computer readable medium of claim 21, wherein the two integrated circuit elements are two clock buffers in a clock distribution network.

23. The computer readable medium of claim 22, wherein the two clock buffers are provided in separate and adjacent stages of the clock distribution network.

24. The computer readable medium of claim 23, wherein the two clock buffers are provided in third and fourth stages of the clock distribution network.

25. The computer readable medium of claim 21, wherein the value specifying a wire length is input by a user.

26. The computer readable medium of claim 21, wherein the value specifying the wire length is chosen to minimize skew between integrated circuit elements in adjacent stages of the integrated circuit design.

27. The computer readable medium of claim 21, wherein the step of defining a routing region in which the wire can be routed includes the following steps:

identifying locations of the terminals of the two integrated circuit elements; and defining a rectangular bounding box having its corners proximate the locations of the terminals.

28. The computer readable medium of claim 21, wherein the program instructions further specify a step of receiving one or more parameters defining the serpentine section's shape.

29. The computer readable medium of claim 21, wherein the step of specifying a wire route specifies that the serpentine section is located proximate one of said integrated circuit elements.

30. The computer readable medium of claim 21, wherein the program instructions further specify the following steps:

determining a maximum wire length that can be provided in the wire route including the serpentine section;

determining if the maximum wire length is less than the value specifying the wire length that must be provided between the terminals; and if the maximum wire length is less than the value specifying the wire length that must be provided between the terminals, outputting a message specifying the difference between the maximum wire length and the value specifying the wire length.

31. The computer readable medium of claim 21, wherein the specified wire route is located on a single metallization layer.

32. The computer readable medium of claim 31, wherein the program instructions further specify the following steps:

determining whether the routing region contains any obstructions that would prevent wire from being routed through or adjacent to such obstructions; and if the routing region does contain one or more such obstructions, redefining the routing region to avoid such obstructions.

33. In a computer system for specifying an integrated circuit design, a method of designing a signal distribution network, the method comprising the following steps:

(a) selecting defined buffers for insertion at defined locations in the signal distribution network, the defined buffers being selected from a buffer data table prepared according to the following steps:
  (i) providing a collection of buffer types available for use at a first stage of the signal distribution network;
  (ii) providing a skew budget for signal propagation between the first stage and a next adjacent stage of said signal distribution network;
  (iii) for said first stage of the signal distribution network, providing a range of incrementally varying values of at least one feature affecting skew; and
  (iv) automatically selecting, for each of said incrementally varying values, one or more suitable buffer types from among the collection of buffer types, which suitable buffer types are selected to meet the skew budget at a corresponding value of the at least one feature affecting skew; and (b) laying out a path of a routing wire in the signal distribution network, the step of laying out including the following steps:
  (i) receiving a value specifying a wire length that must be provided between two buffers of the signal distribution network;
  (ii) defining a routing region in which the wire can be routed; and
  (iii) automatically specifying a wire route within said routing region for connecting said two buffers, said wire route having at least one serpentine section with one or more legs as needed so that the wire route has the specified wire length.

34. The method of claim 33, wherein the signal distribution network is a clock distribution network and wherein the two buffers are two clock buffers.

35. The method of claim 34, wherein the two clock buffers are provided in separate and adjacent stages of the clock distribution network.

36. The method of claim 35, wherein the two clock buffers are provided in L3 and L4 stages of the clock distribution network.

37. The method of claim 33, wherein the value specifying a wire length is input by a user.

38. The method of claim 33, wherein the value specifying the wire length is chosen to minimize skew between integrated circuit elements in adjacent stages of the integrated circuit design.

39. The method of claim 33, wherein in the step of providing a collection of buffer types, the first stage is an L4 stage.

* * * * *